(12) United States Patent
Kleiner et al.

(10) Patent No.: US 10,379,172 B2
(45) Date of Patent: Aug. 13, 2019

(54) MAGNETIC FIELD LOCALIZATION AND NAVIGATION

(71) Applicant: iRobot Corporation, Bedford, MA (US)

(72) Inventors: Alexander D. Kleiner, Pasadena, CA (US); Nikolai Romanov, Oak Park, CA (US); Frederic D. Hook, Fontana, CA (US)

(73) Assignee: iRobot Corporation, Bedford, MA (US)

( * ) Notice: Subject to any disclaimer, the term of this patent is extended or adjusted under 35 U.S.C. 154(b) by 882 days.

(21) Appl. No.: 14/799,319

(22) Filed: Jul. 14, 2015

(65) Prior Publication Data

US 2016/0377688 A1 Dec. 29, 2016

Related U.S. Application Data

(60) Provisional application No. 62/171,498, filed on Jun. 5, 2015.

(51) Int. Cl.
*G01R 33/00* (2006.01)
*G01B 7/30* (2006.01)
(Continued)

(52) U.S. Cl.
CPC ....... *G01R 33/0035* (2013.01); *A01D 34/008* (2013.01); *B25J 9/1694* (2013.01);
(Continued)

(58) Field of Classification Search
CPC . G01R 33/0035; Y10S 901/46; Y10S 901/30; Y10S 901/01; G05D 2201/0208;
(Continued)

(56) References Cited

U.S. PATENT DOCUMENTS 4,737,794 A 4/1988 Jones
8,868,237 B2 10/2014 Sandin et al.
(Continued)

FOREIGN PATENT DOCUMENTS

EP 1184684 3/2002

OTHER PUBLICATIONS

Raab et al., "Magnetic Position and Orientation Tracking System," IEEE Transactions on Aerospace and Electronic Systems, Sep. 1979, 5(5):709-718.

(Continued)

*Primary Examiner* — Melissa Koval
*Assistant Examiner* — Trung Nguyen
(74) *Attorney, Agent, or Firm* — Fish & Richardson P.C.

(57) ABSTRACT

A mobile robot includes a body movable over a surface within an environment, a calibration coil carried on the body and configured to produce a calibration magnetic field, a sensor circuit carried on the body and responsive to the calibration magnetic field, and a controller carried on the body and in communication with the sensor circuit. The sensor circuit is configured to generate calibration signals based on the calibration magnetic field. The controller is configured to calibrate the sensor circuit as a function of the calibration signals, thereby resulting in a calibrated sensor circuit configured to detect a transmitter magnetic field within the environment and to generate detection signals based on the transmitter magnetic field. The controller is configured to estimate a pose of the mobile robot as a function of the detection signals.

24 Claims, 10 Drawing Sheets

(51) Int. Cl.
  *B25J 9/16* (2006.01)
  *A01D 34/00* (2006.01)
  *G01S 1/00* (2006.01)
  *G05D 1/02* (2006.01)
(52) U.S. Cl.
  CPC ............... *G01B 7/30* (2013.01); *G01S 1/00* (2013.01); *G05D 1/0261* (2013.01); *G05D 2201/0208* (2013.01); *Y10S 901/01* (2013.01); *Y10S 901/30* (2013.01); *Y10S 901/46* (2013.01)
(58) Field of Classification Search
  CPC ......... G05D 1/0261; G01S 1/00; G01L 37/30; B25J 9/1694; A01D 34/008
  USPC ...... 324/200, 202, 207.24–207.26, 600, 601, 324/74, 130, 500, 750.02
  See application file for complete search history.

(56) References Cited

U.S. PATENT DOCUMENTS

| 8,881,339 | B2 | 11/2014 | Gilbert et al. |
| 9,020,637 | B2 | 4/2015 | Schnittman |
| 2007/0055125 | A1* | 3/2007 | Anderson ............... A61B 5/06 600/407 |
| 2009/0030646 | A1* | 1/2009 | Jones .................. G01R 33/04 702/150 |
| 2009/0287443 | A1 | 11/2009 | Jascob et al. |
| 2011/0167574 | A1 | 7/2011 | Stout et al. |
| 2012/0029754 | A1* | 2/2012 | Thompson ........... A01D 34/008 701/23 |
| 2013/0296737 | A1 | 11/2013 | McMillan et al. |
| 2014/0253114 | A1 | 9/2014 | Khamesee et al. |
| 2015/0006015 | A1* | 1/2015 | Sandin ................ G05D 1/0255 701/23 |

OTHER PUBLICATIONS

U.S. Appl. No. 62/059,637, titled "Surface Cleaning Pad," filed Oct. 3, 2014, 72 pages.
U.S. Appl. No. 14/512,098, filed Oct. 10, 2014, Robotic Lawn Mowing Boundary Determination.
International Preliminary Report on Patentability in International Application No. PCT/US2015/061627, dated Dec. 5, 2017, 11 pages.
Supplementary European Search Report in European Application No. 15894497.5, Jan. 24, 2019, 6 pages.

* cited by examiner

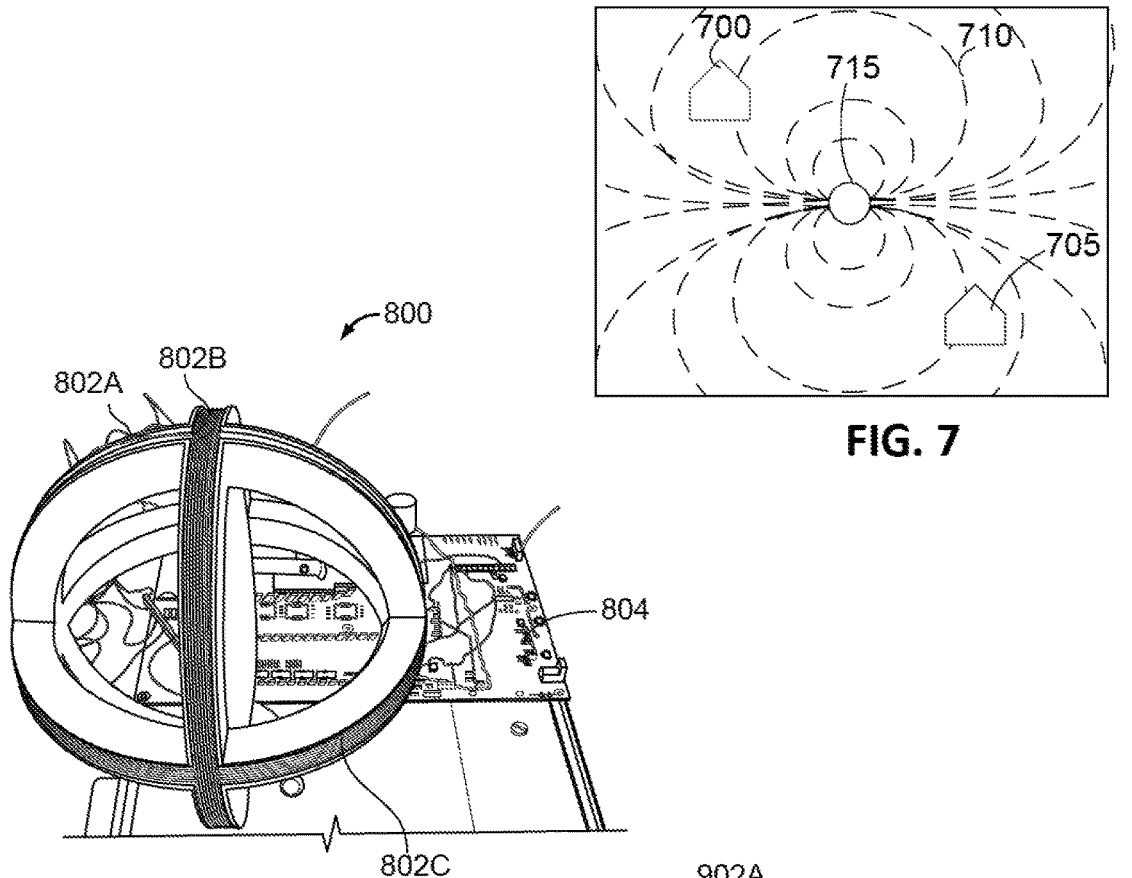
FIG. 7
FIG. 8
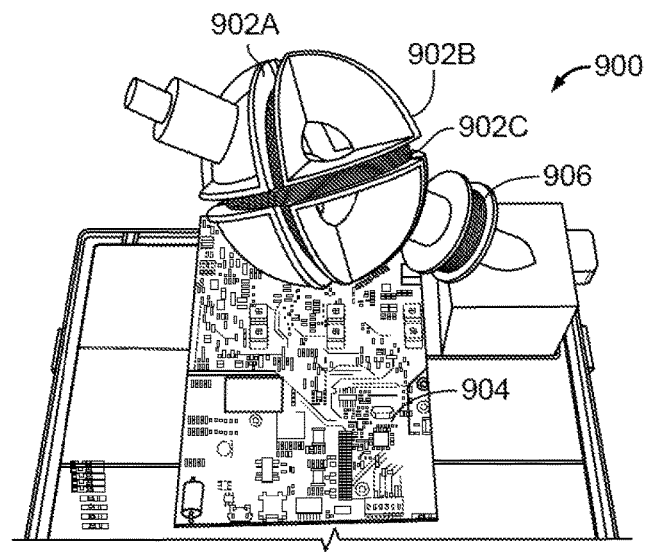
FIG. 9

MAGNETIC FIELD LOCALIZATION AND NAVIGATION

CROSS-REFERENCE TO RELATED APPLICATION

This application claims the benefit of U.S. Provisional Application Ser. No. 62/171,498 filed on Jun. 5, 2015. U.S. Provisional Application Ser. No. 62/171,498 is incorporated herein by reference.

TECHNICAL FIELD

This specification relates generally to systems and methods for determining the location of mobile robots using magnetic field detection.

BACKGROUND

Localization techniques of mobile robots can include processes that allow a robot to determine its position and orientation (e.g., a pose) with respect to its surroundings. A robot that can build a map of its surroundings can localize itself within the map to exhibit a degree of autonomy. This process of building a map and using the generated map is known as Simultaneous Localization and Mapping (SLAM). SLAM relates to the building of a map (mapping) and the use of the map (localizing), and therefore includes a process associated with localization and a process associated with mapping. The robot can execute these processes simultaneously or in a multiplexed fashion. SLAM techniques can include building a map using odometry, mechanical contact sensors or non-contact ranging sensors such as a laser rangefinder or image based sensor.

SUMMARY

A mobile robot can detect magnetic fields in an environment using sensor coils that generate electrical signals in response to the magnetic fields. A controller of the mobile robot can use the electrical signals to determine a position and an orientation (e.g., a pose) of the robot relative to a magnetic field transmitter that emits a transmitter magnetic field into the environment. The electrical signals generated by the sensor coils can include detection signals generated in response to the transmitter magnetic field emitted by the magnetic field transmitter and calibration signals generated in response to a calibration magnetic field emitted by at least one calibration coil on the robot. The calibration coil can be positioned on the robot such that the sensor coils respond similarly to the calibration magnetic field (e.g., generate a similar amplitude in response to the calibration magnetic field). The sensor soils can include three separate coils, each of which generates a detection signal and a calibration signal.

In some examples, because the calibration coil is arranged such that the sensor coils are expected to respond equally to the calibration magnetic field generated by the calibration coil the controller controls the calibration coil on the robot to normalize each of the detection signals generated by the sensor coils. Based on the calibration signals, the controller can adjust gains of a sensor circuit that amplifies that the electrical signals generated in response to magnetic fields. Based on the amplitudes of the calibration signal generated by each of the sensor coils, the controller can normalize the detection signal generated by each of the sensor coils.

In some examples, the controller maintains amplitudes of detection data representing the detection signals within a predetermined dynamic range. The amplitudes of the transmitter magnetic field can degrade at locations farther from the magnetic field transmitter, thereby causing the detection signals to decrease in amplitude in response. The controller can modulate an amplitude of the calibration magnetic field based on the amplitudes of the detection data. As the amplitudes of the detection data decrease due to movement of the robot farther from the magnetic field transmitter, the controller can modulate the amplitude of the calibration magnetic field at specific threshold values such that the gains of the sensor circuit amplify the detection signals to cause the detection data to have amplitudes within the predetermined dynamic range.

In some examples, as the robot navigates about the environment, the controller can determine the pose of the robot using a transfer function (e.g., a map or a mapping) that maps the detection signals (e.g., an amplitude or phase of the detection signals) to positions and orientations of the robot within the environment. In some cases, the robot can include a statically calibrated transfer function. As the robot navigates about the environment, the robot can dynamically calibrate the detection signals to relative distances estimated by movement signals. The movement signals can be indicative of distances traveled by, velocities of, or accelerations of the robot. By calibrating the detection signals to the movement signals, the robot can estimate the pose of the robot when the robot encounters the distortions in the magnetic field.

In some examples, a mobile robot includes a body movable over a surface within an environment, a calibration coil carried on the body and configured to produce a calibration magnetic field, a sensor circuit carried on the body and responsive to the calibration magnetic field, and a controller carried on the body and in communication with the sensor circuit. The sensor circuit is configured to generate calibration signals based on the calibration magnetic field. The controller is configured to calibrate the sensor circuit as a function of the calibration signals, thereby resulting in a calibrated sensor circuit configured to detect a transmitter magnetic field within the environment and to generate detection signals based on the transmitter magnetic field. The controller is configured to estimate a pose of the mobile robot as a function of the detection signals.

In some examples, the robot can be a robot lawnmower, the surface can include a lawn, and the robot further can include a cutting mechanism below the body. The controller can be configured to exchange information with a remote device to cause the body to move across the lawn while cutting the lawn using the cutting mechanism. The information can include a position of the mobile robot relative to a point on the lawn and instructions for movement across the lawn.

In some examples, the robot can be a cleaning robot and the surface can include a floor of a room. The controller can be configured to exchange information with a remote device to cause the body to move across the floor to clean the floor using a floor cleaning mechanism or cleaning pad of the robot. The information can include a position of the mobile robot in the room and instructions for movement throughout the room.

In some examples, the sensor circuit can include a filter circuit and sensor coils responsive to the transmitter magnetic field. The controller can be configured to determine coefficients for the filter circuit based on data representing the calibration signals, and apply the coefficients to the filter circuit to normalize a difference in gains of frequency channels corresponding to different frequencies detected by the sensor coils.

In some examples, the sensor circuit can include an amplifier circuit. The controller can be configured to determine gains of the amplifier circuit based on data representing the calibration signals, and apply the gains to the amplifier circuit to enable dynamic changes to amplitudes of the calibration signals.

In some examples, the sensor circuit can include three sensor coils defining different coil axes and arranged to be responsive to different components of the transmitter magnetic field. The coil axes can be orthogonal in three dimensions. The sensor coils can be arranged to approximate at least part of an outline of a sphere.

In some examples, the controller can be configured to calibrate the sensor circuit as a function of the calibration signals and pre-calibration data representing the transmitter magnetic field. The controller can be configured to compare, to a threshold, a difference between an amplitude of the calibration magnetic field and an amplitude of the transmitter magnetic field, and calibrate the sensor circuit based on the difference.

In some examples, the calibrated sensor circuit can be configured to generate the detection signals in response to detecting frequencies of components of the transmitter magnetic field between maximum and minimum magnetic field frequencies based on an output of the calibration coil.

In some examples, the mobile robot can include a motor operable to move the body across the surface in response to detection of the transmitter magnetic field by the sensor circuit. The motor can be configured to reduce a speed of the robot upon detection of the transmitter magnetic field.

In some examples, the mobile robot can be untethered.

In some examples, the controller can be configured to estimate the pose of the mobile robot by performing operations including performing a fast Fourier transform using data representing the detection signals to obtain a phase and an amplitude of the transmitter magnetic field and determining a drift of the phase over time to detect changes in relative orientations of transmission coils that transmit the transmitter magnetic field and sensor coils in the sensor circuit that detect the transmitter magnetic field.

In some examples, the mobile robot can include a movement detector responsive to at least one of distance traveled by the robot, speed of the robot, and acceleration of the robot, and configured to generate a movement signal. The controller can be configured to generate a map based on the movement signal and to determine, as a function of data representing the movement signal, the pose of the robot relative to the environment.

In some examples, the sensor circuit can include three sensor coils with orthogonal axes in three dimensions. The calibration coil can be arranged to define equal angles with respect to each of the three sensor coils.

In some examples, an autonomous robot system includes a magnetic field transmitter comprising transmitter coils configured to generate a transmitter magnetic field, and a robot configured to autonomously maneuver about an environment relative to the magnetic field transmitter. The robot includes a calibration coil configured to generate a calibration magnetic field. The autonomous robot system includes a magnetic field receiver. The magnetic field receives includes sensor coils responsive to the transmitter magnetic field and to the calibration magnetic field. The autonomous robot system further includes a position determination circuit configured to determine a position of the robot relative to the magnetic field transmitter, based on detection of the transmitter magnetic field by the magnetic field receiver. The position determination circuit is configured to perform a self-calibration based on data representing the calibration magnetic field as sensed by the magnetic field receiver.

In some examples, the magnetic field transmitter can include three transmission coils. Each of the three transmission coils can define a transmitter coil axis and be configured to generate a component of the transmitter magnetic field. The transmitter coil axes can be orthogonal in three dimensions. The transmission coils can be arranged to approximate at least part of an outline of a first sphere. The magnetic field receiver can include three sensor coils. Each of the three sensor coils can define a sensor coil axis and be responsive to a component of the transmitter magnetic field. The sensor coil axes can be orthogonal in three dimensions. The sensor coils can be arranged to approximate at least part of an outline of a second sphere.

In some examples, the first sphere can be larger than the second sphere.

In some examples, the calibration coil can define an equal angle with respect to each of the sensor coils. The angle can be between 50 degrees and 60 degrees.

In some examples, the robot and magnetic field transmitter can be physically disconnected.

In some examples, a method of estimating pose as performed by a mobile includes producing a calibration magnetic field using a calibration coil of the mobile robot, and detecting the calibration magnetic field using a sensor circuit of the mobile robot. The method includes calibrating the sensor circuit based on calibration data representing the calibration magnetic field, thereby resulting in a calibrated sensor circuit. The method further includes detecting a transmitter magnetic field using the calibrated sensor circuit, and estimating a pose of the mobile robot based on data representing the transmitter magnetic field, as detected using the calibrated sensor circuit.

In some examples, the sensor circuit can include a filter circuit and sensor coils responsive to the transmitter magnetic field. Calibrating the sensor circuit can include determining coefficients for the filter circuit based on the calibration data, and applying the coefficients to the filter circuit to normalize a difference in gains of frequency channels corresponding to different frequencies received by the sensor coils.

In some examples, the sensor circuit can include an amplifier circuit. Calibrating the sensor circuit can include determining gains of the amplifier circuit based on the calibration data, and applying the gains to the amplifier circuit to enable dynamic changes to amplitudes of calibration signals output by the sensor circuit.

In some examples, calibrating the sensor circuit can be based on both the calibration data and pre-calibration data representing the transmitter magnetic field.

In some examples, calibrating the sensor circuit can include comparing, to a threshold, a difference between an amplitude of the calibration magnetic field and an amplitude of the transmitter magnetic field, and calibrating the sensor circuit based on the difference.

In some examples, the calibrated sensor circuit can generate detection signals in response to detecting frequencies of components of the transmitter magnetic field. The frequencies can be between a maximum magnetic field frequency and a minimum magnetic field frequency. The maximum magnetic field frequency and the minimum magnetic field frequency can be based on an output of the calibration coil.

Advantages of the foregoing may include, but are not limited to, the following. The robot can use the detection signals generated by the sensor coils to estimate the pose of the robot with respect to a transmitter magnetic field generated by a feature within the environment (e.g., a stationary magnetic field transmitter). In many instances, the robot can estimate its pose based on the transmitter magnetic field. Thus the robot does not need to estimate the position by tracking an accumulation of pose changes over time. Estimates of position and orientation are less prone to errors that can accumulate over time.

Additionally, a robot placed in the environment can estimate its pose upon initialization. If the robot is moved or placed in an unknown location, the controller can determine the pose of the robot based on the measured magnetic field properties. To determine its pose, the robot thus does not need previous data representing its previous poses.

The systems and methods herein also include calibration processes that are believed to improve accuracy, precision, and computational efficiency of estimating the position and orientation of the robot. In one example, by normalizing the detection data representing the detection signals to the calibration signals that are not expected to vary significantly between sensor coils, the controller can improve accuracy and consistency between detection data originating from different sensor coils and received by the controller.

In another example, as the robot's distance from the transmitter increases, the amplitude of the detection signals can decrease making the magnetic field more difficult to distinguish from the other detection signals. By dynamically changing the calibration magnetic fields and hence the calibration signals generated by the sensor coils, the controller can reduce the dynamic range (e.g., a minimum and a maximum of the detection signals) of the normalized detection signals to increase computational efficiency. Therefore, even as the detection signals decrease in amplitude over a large range, the detection data that the controller receives can vary within a smaller dynamic range, thus improving computational efficiency and reducing a need for expensive components that can process signals having a large dynamic range.

Any two or more of the features described in this specification, including in this summary section, can be combined to form implementations not specifically described herein.

The robots, or operational aspects thereof, described herein can be implemented as/controlled by a computer program product that includes instructions that are stored on one or more non-transitory machine-readable storage media, and that are executable on one or more processing devices to control (e.g., to coordinate) the operations described herein. The robots, or operational aspects thereof, described herein can be implemented as part of a system or method that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

FIG. 7 is a top view of multiple potential poses of a robot in an environment with a magnetic field transmitter.

FIG. 8 is a front perspective view of a magnetic field transmitter.

FIG. 9 is a front perspective view of a detection and control system.

Like reference numerals in different figures indicate like elements.

DETAILED DESCRIPTION

Figure 1A:
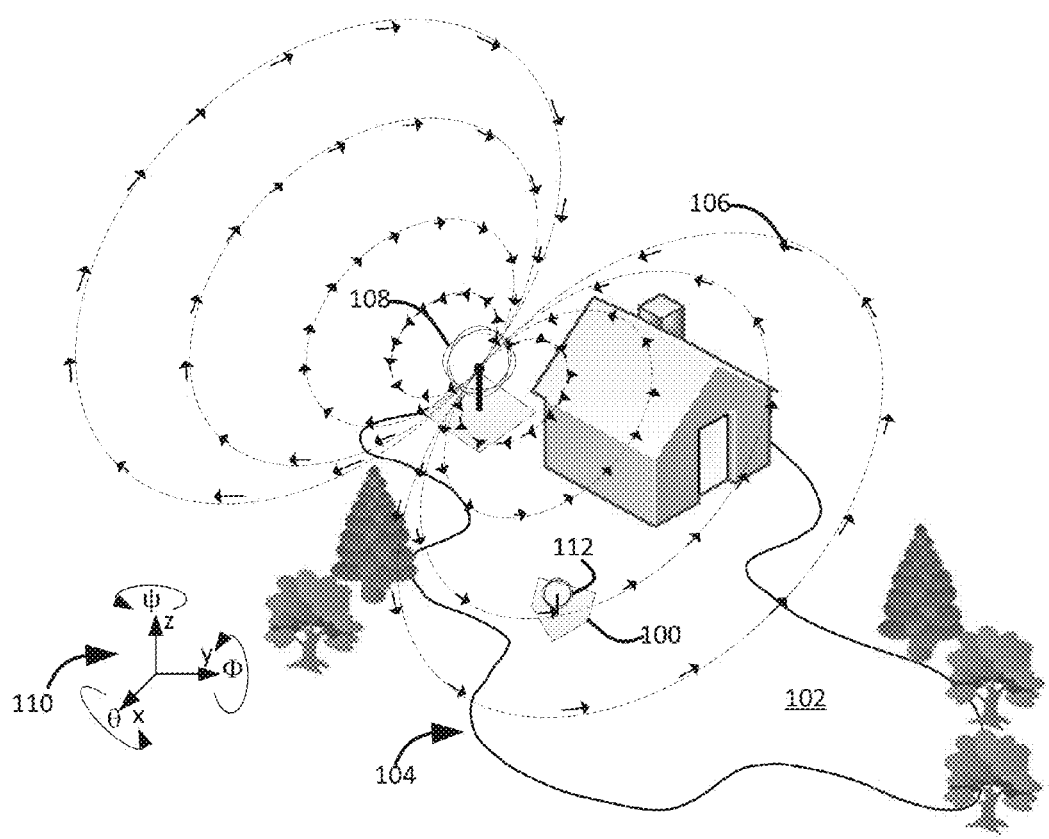
FIG. 1A is a perspective view of a mobile robot navigating in an environment with a magnetic field transmitter emitting a magnetic field.

Described herein are example navigation systems for mobile robots that use magnetic fields to allow the mobile robot to estimate its pose (e.g., a position and an orientation) in an environment. The navigation system can include a magnetic field transmitter that emits a transmitter magnetic field into the environment. The mobile robot can be configured to detect the transmitter magnetic field emitted by the magnetic field transmitter. Based on the detected transmitter magnetic field, the mobile robot can traverse or navigate within the environment. The mobile robot can include a sensor circuit that measures the transmitter magnetic field to generate detection signals, which are electrical signals representing the transmitter magnetic field. The sensor circuit operable with the controller outputs detection data based on the detection signals. A controller of the robot, based on the detection data, can estimate the position and the orientation of the robot within the environment.

For example, a navigation system can include a transmitter having three generally orthogonal coils configured to generate three orthogonal components of the transmitter magnetic field (e.g., magnetic dipole fields). Electrical signals used to generate components of the transmitter magnetic field are multiplexed so that the components of the transmitter magnetic field are distinguishable from one another. The robot includes multiple receiving antennae (e.g., three sets of generally orthogonally coils). By generating three orthogonal components of the transmitter magnetic field, the transmitter can define a reference coordinate frame having three orthogonal axes (e.g., an x-, y-, and z-axis.). As a result, the pose of the robot measured with respect to a three-dimensional space can be determined based on measurements of the transmitter magnetic field. Thus, estimations of the position and the orientation of the robot are based on nine measurements of three components of the transmitter magnetic field.

The controller can include calibration and normalization processes to improve accuracy, precision, and efficiency of the navigation system. The controller can calibrate the sensor circuit to stable reference values that do not vary as the mobile robot navigates about the environment. Thus, the controller can calibrate an uncalibrated sensor circuit, resulting in a calibrated sensor circuit. Such a calibration process can increase accuracy and precision of the pose estimated from the detection signals.

In one example, the mobile robot includes a calibration coil that produces a calibration magnetic field whose amplitude and phase do not vary at the location of sensor coils as the mobile robot navigates about the environment. The sensor coils of the sensor circuit detects the calibration magnetic field and each generate calibration signals in response to the calibration magnetic field. The calibration signals generated by each of the sensor coils are not expected to differ from one another significantly because of the arrangement of the calibration coils relative to sensor coils. Therefore, the detection data can be normalized based on the calibration signals. The controller can be configured to calibrate the sensor circuit using the calibration signals such that the detection data representing the detection signals from each of the sensor coils are normalized to the calibration signals, thus resulting in the calibrated sensor circuit. The calibrated sensor circuit is configured to detect the transmitter magnetic field within the environment and to output the detection data based on the transmitter magnetic field. The controller can then process the detection data to estimate the pose of the robot. The calibration described herein is a dynamic calibration that is performed at regular intervals such that the signals measured by the sensor coils responsive to the transmitter magnetic field generated by the transmitter are calibrated as the amplitude of the components of the transmitter magnetic field vary.

Through on-board calibration and/or the use of other sensors, the controller can reduce errors and inaccuracies in pose estimations from the detection signals due to errors caused by, for example, deformations and distortions in the transmitter magnetic field. These deformations and distortions can be caused by, for example, metallic structures and other large conductive objects in the environment that produce scattering of magnetic-dipole structure. For structures and objects that are stationary in the environment, the transmitter magnetic field will be consistently distorted by their presence. As such, the robot can measure and store information about the transmitter magnetic field. When the robot returns to the same location, the measures of the distorted field can provide the location. In one example, the controller bases the pose estimations on movement signals (e.g., signals indicative of distance traveled by the robot, speed of the robot, and/or acceleration of the robot) from a movement sensor on the robot. The movement signals are robust to the magnetic field deformations and thus can allow the controller to detect magnetic field deformations that can manifest in the detection signals. Provided that the large conductive objects in the environment do not move, the robot can also use the magnetic field patterns generated by these objects as localization features for a simultaneous localization and mapping (SLAM) system. Using signals produced by the calibrated sensor circuit and the movement sensor in conjunction, the controller can accurately and precisely determine the pose of the mobile robot in the environment.

Overview of Navigation System

As shown in FIG. 1A, a mobile robot 100 navigates or maneuvers about a surface 102 in an environment 104 and estimates its pose within the environment 104 based on a transmitter magnetic field 106 emitted by a magnetic field transmitter 108. The estimated pose includes an orientation and position of the robot measured relative to a reference point in the environment 104 that generally does not move (e.g., the magnetic field transmitter 108). In the example shown in FIG. 1A, the robot 100 can be a lawn mowing robot that mows the surface 102, which can include a lawn or grass. However, the systems and methods described herein can be applied to any type of mobile device. The robot 100 moves around the environment 104 relative to the magnetic field transmitter 108.

Figure 1B:
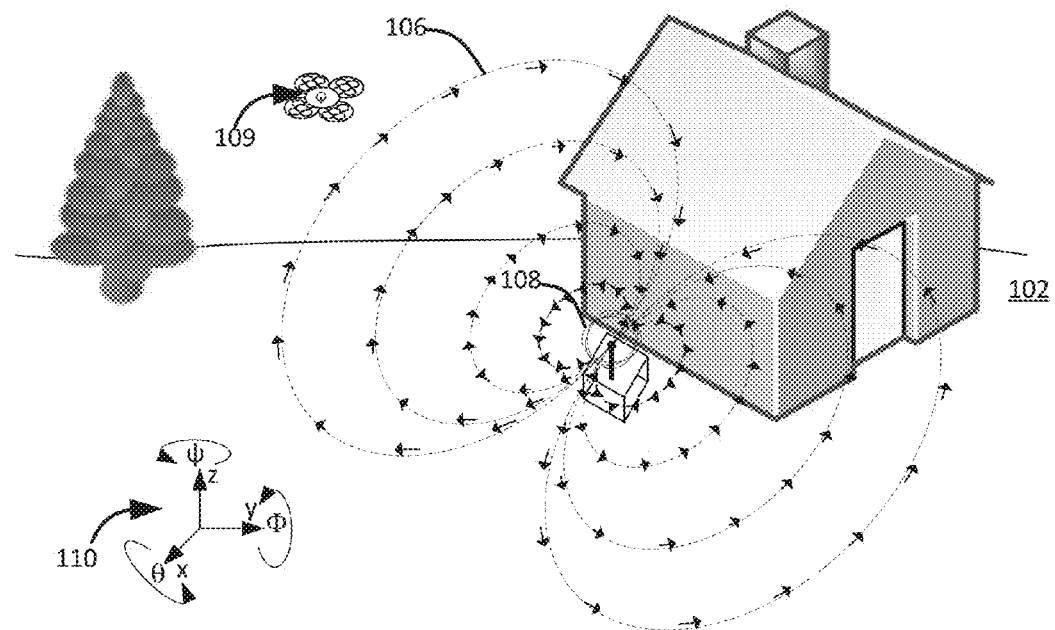
FIG. 1B is a perspective view of an aerial robot navigating in an environment with a magnetic field transmitter emitting a magnetic field.

Since the transmitter magnetic field 106 emitted by a magnetic field transmitter 108 propagates outward relative to the magnetic field transmitter 108 in all three dimensions in space (e.g., a three-dimensional coordinate system defined by the x-, y-, and z-axes); the robot is not restricted to maneuvering about a surface 102, but can maneuver around the environment 104 including coordinates above surface 102. In the example shown in FIG. 1B, an aerial robot 109 can be an aerial drone capable of hovering or flying above the surface 102. The magnetic field can be used to determine the x, y position of the aerial robot 109 and the altitude or elevation of the aerial robot 109.

The mobile robot 100 can estimate its position with respect to a coordinate system 110 including orthogonal x-, y-, and z-axes. The mobile robot 100 can further estimate its orientation within the coordinate system (e.g., θ orientation about the x-axis, Φ orientation about the y-axis, and ψ orientation about the z-axis). A magnetic field receiver 112 disposed on the robot 100 responds to changes in attributes (e.g., phase and amplitude) of the transmitter magnetic field 106 as the robot 100—and hence the magnetic field receiver 112 of the robot 100—moves and rotates in the environment 104. The magnetic field receiver 112 generates electrical signals in response to the transmitter magnetic field 106, and the robot 100 can estimate its pose based on those electrical signals.

Figure 2:
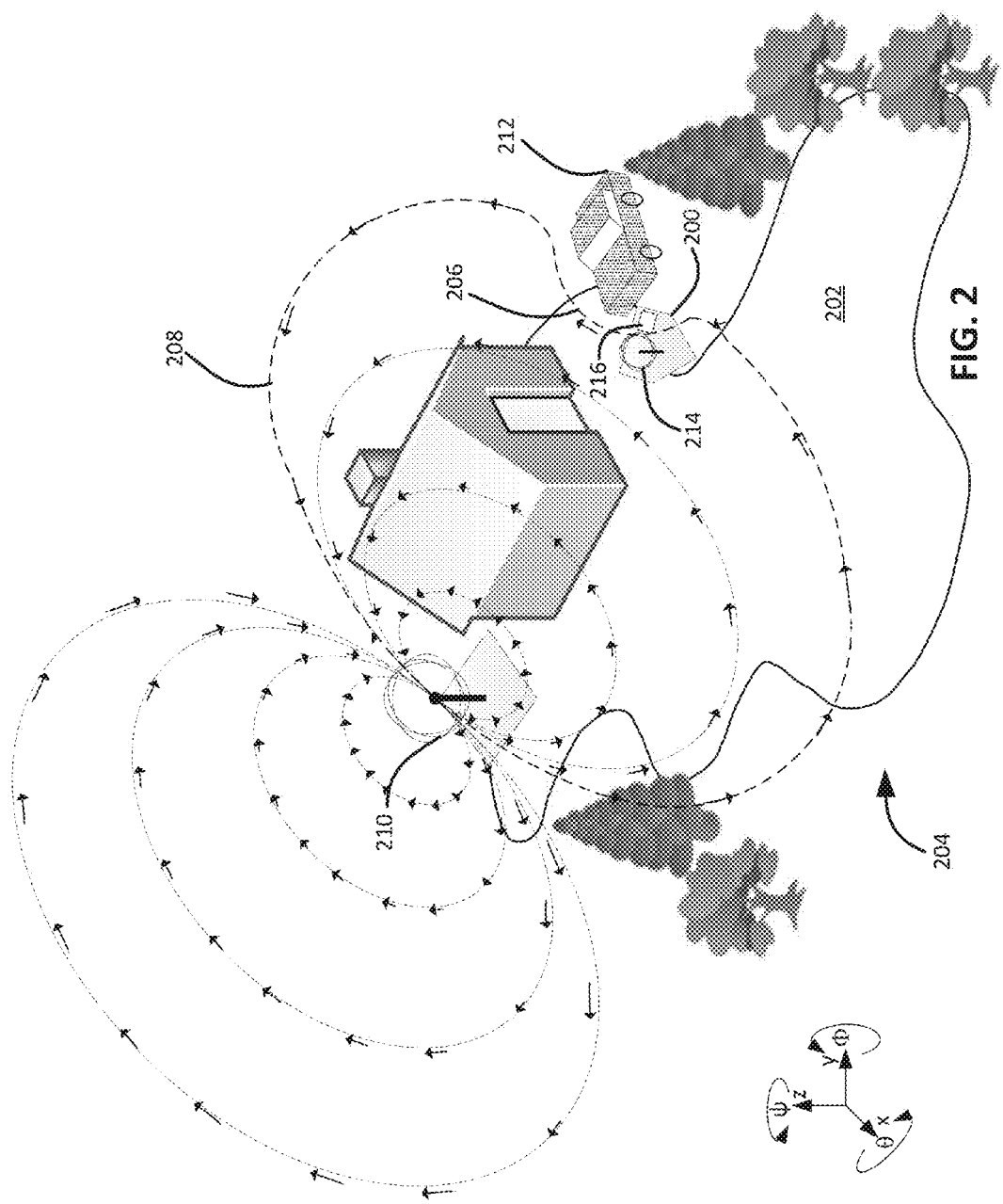
FIG. 2 is a perspective view of a mobile robot navigating in an environment with a magnetic field transmitter emitting a magnetic field that exhibits a distortion based on aspects of the environment.

In some examples, as shown in FIG. 2, as a robot 200 (e.g., the robot 100 of FIG. 1A) navigates or maneuvers about a surface 202 of an environment 204, the robot 200 can detect a distortion 206 in a transmitter magnetic field 208 emitted by a magnetic field transmitter 210. A large conductive object, such as a car 212, can distort nearby magnetic fields, thus causing the distortion 206 in the transmitter magnetic field 208. A magnetic field receiver 214 disposed on the robot 200 can detect the distortion 206 in the transmitter magnetic field 208 and store data representing detection signals corresponding to the distortion 206 measured at a particular location. A movement sensor 216 also disposed on the robot 200 can detect motion characteristics (e.g., distance traveled, velocity, or acceleration) of the robot 200.

The robot 200 can use signals generated by the movement sensor 216 and the magnetic field receiver 214 to detect the distortion 206. For example, the magnetic field receiver 214 can generate detection signals indicating variations in amplitude and phase of the transmitter magnetic field 208 (e.g., the distortion 206) that generally occur due to large conductive objects. The movement sensor 216 can generate movement signals indicating an amount of movement of the robot 200. The robot 200 can process the detection signals and the movement signals such that detection signals indicating the distortion 206 accurately reflect an amount of movement of the robot 200 as the robot 200 moves near the distortion 206. In the presence of distortions, the robot 200 can thus estimate the pose of the robot 200. In some cases, by determining the presence of the distortion 206, the robot 200 can learn a topography or a map that can serve as a transfer function between the detection signals generated in response to the transmitter magnetic field 208 and the pose of the robot. The robot 200 can thus use the distortion 206 as a feature for re-localization in SLAM methods.

Generally, a controller can execute operations and processes to estimate a position and orientation of a magnetic field receiver relative to a magnetic field transmitter based on a magnetic field generated by the magnetic field transmitter. The operations and processes can include physical assumptions that simplify computations and thus increase processing efficiency of the controller. In one example, the operations and processes can assume the magnetic field generated by the magnetic field transmitter is quasi-static and therefore do not account for higher-order terms, thus simplifying computations required for estimating the position and the orientation of the magnetic field receiver. The assumption of the quasi-static magnetic field do not significantly affect the accuracy and precision of the estimated positions and orientations described herein at the expected distances between the magnetic field transmitter and the magnetic field receiver, e.g., from 0 to 10 km.

Structural assumptions of transmission coils and sensor coils can further influence precision and accuracy. In some examples, three separate and mutually orthogonal transmission coils of the magnetic field transmitter generate the transmitter magnetic field. Each transmission coil generates a component of the transmitter magnetic field, and each component is thus substantially orthogonal to one another.

In further examples, three separate and mutually orthogonal sensor coils of the magnetic field receiver detect the magnetic field. Exemplary processes that compute position and orientation of a magnetic field receiver relative to a magnetic field transceiver are described in detail in U.S. Pat. No. 4,737,794, titled "Method and apparatus for determining remote object orientation and position," and filed on Dec. 9, 1985, the contents of which are incorporated herein in its entirety.

Figure 3:
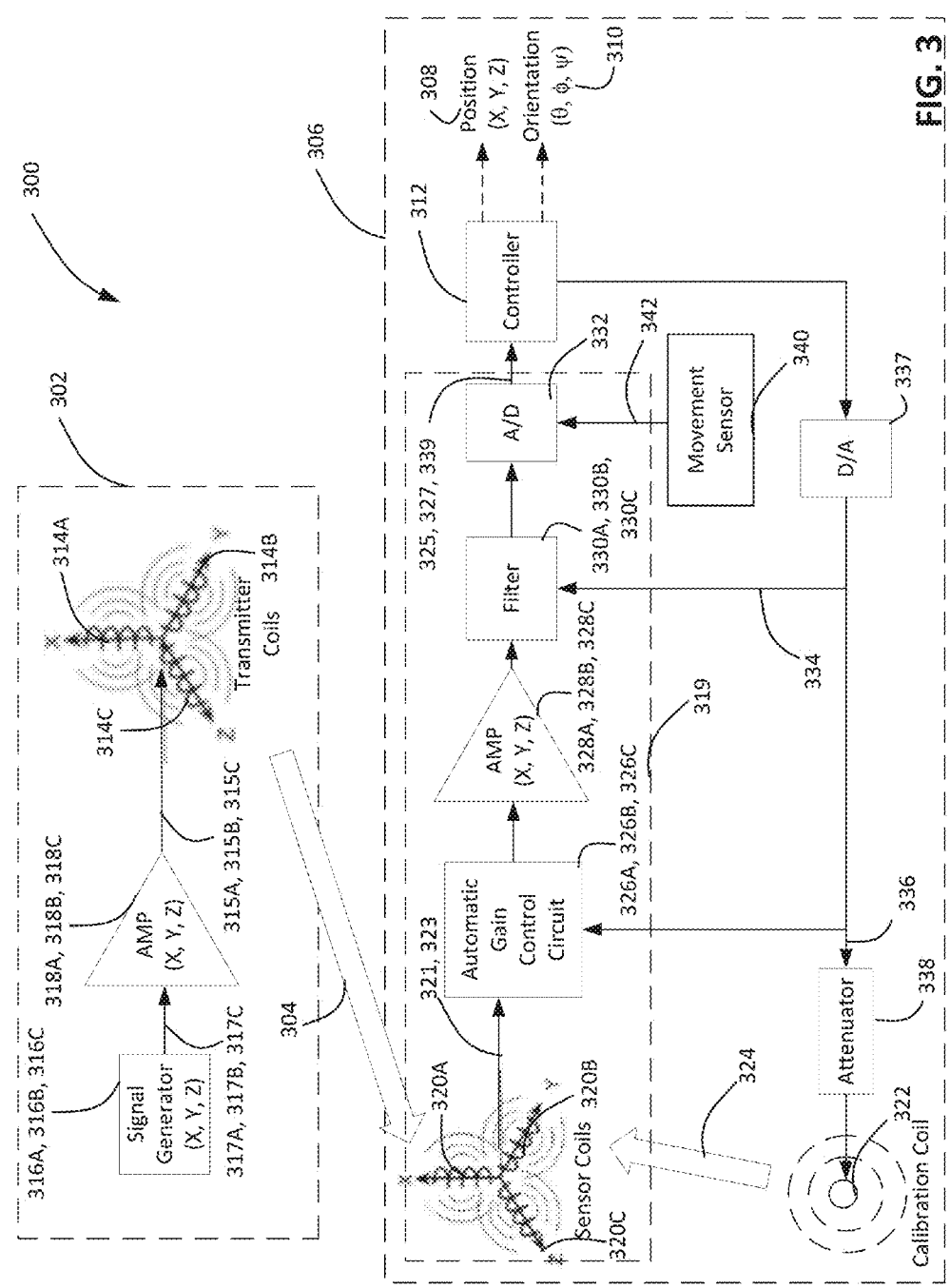
FIG. 3 is a block diagram of a magnetic field transmitter and a detection and control system of a robot.

To estimate pose using the operations and processes described herein, a mobile robot (e.g., the robot 100 of FIG. 1A, the robot 109 of FIG. 1B, or the robot 200 of FIG. 2) navigating about an environment can include circuitry that detects a transmitter magnetic field emitted by a magnetic field transmitter to estimate position and orientation of the robot in the environment relative to the magnetic field transmitter. FIG. 3 shows a block diagram of a navigation system 300 including a magnetic field transmitter 302 (e.g., the magnetic field transmitter 108 of FIG. 1A or the magnetic field transmitter of FIG. 2) that emits a transmitter magnetic field 304. Detection and control system 306 located on the robot generates electrical signals in response to the transmitter magnetic field 304. The detection and control system 306 includes a position determination circuit in which a controller 312 of the detection and control system 306, based on the electrical signals, can determine a three-dimensional position 308 and a three-dimensional orientation 310 of the robot relative to the position and orientation of the magnetic field transmitter 302. The position 308 and the orientation 310 of the robot are therefore measured relative to a reference point in the environment that is positioned or anchored in a fixed location and generally does not move (e.g., the magnetic field transmitter 302).

Magnetic Field Transmitter

The magnetic field transmitter 302 remains at a stationary position and orientation in the environment while it emits the transmitter magnetic field 304 into the environment. The magnetic field transmitter 302 can remain at the stationary position and orientation in the environment during an operation (e.g., a mowing operation, cleaning operation, navigation operation, and other operations performed by the robot). The magnetic field transmitter 302 thus does not move relative to a fixed point in the environment, for example, during the operation of the robot. The detection and control system 306 can be physically untethered to the magnetic field transmitter 302 such that, for example, the detection and control system 306 is substantially electrically isolated from the magnetic field transmitter 302.

The magnetic field transmitter 302 emits the transmitter magnetic field 304 using transmission coils 314. The transmission coils 314 include three separate transmission coils 314A, 314B, 314C (herein collectively referred to as transmission coils 314). Each transmission coil 314A. 314B, 314C receives an amplified electrical signal 315A, 315B, 315C from a transmitter circuit including a signal generator 316A, 316B, 316C (herein collectively referred to as signal generators 316) and a power amplifier 318A. 318B, 318C (herein collectively referred to as power amplifiers 318). The magnetic field transmitter 302 therefore includes three independent signal generators 316A, 316B, 316C and three independent power amplifiers 318A, 318B, 318C. For each coil 314A, 314B, 314C, the associated amplified electrical signal 315A, 315B, 315C (herein collectively referred to as amplified electrical signals 315) originates as an associated unamplified electrical signal 317A, 317B, 317C (herein collectively referred to as unamplified electrical signals 317) generated by the associated signal generator 316A, 316B, 316C'. The associated power amplifier 318A, 318B, 318C receives the associated unamplified electrical signal 317A, 317B, 317C and amplifies the power of the unamplified electrical signal 317A, 317B, 317C to produce the amplified electrical signal 315A, 315B, 315C that each of the transmission coils 314A, 314B, 314C receives. Using the amplified electrical signal 315A, 315B, 315C produced from its respective signal generator 316A, 316B, 316C and power amplifier 318A, 318B, 318C, each of the transmission coils 314A, 314B, 314C generates an associated component of the transmitter magnetic field 304. While the transmitter magnetic field 304 is described to include three separate components each generated by one of the transmission coils 314A, 314B, 314C, in some implementations, the transmitter magnetic field 304 can be a superposition of three separate magnetic fields each corresponding to one of the components generated by the transmission coils 314A, 314B, 314C.

The transmissions coils 314 are oriented such that the coil axes of the transmission coils 314 form a linearly independent basis of the three-dimensional space of the environment. Because the transmission coils 314 have linearly independent axes, amplitudes and frequencies of the electrical signals produced by the signal generators 316 and the power amplifiers 318 can control amplitudes and frequencies of the transmitter magnetic field 304 in all three dimensions in space (e.g. x, y, z). In one example, a controller of the magnetic field transmitter 302 can adjust phases, frequencies, and amplitudes of the signals generated at the signal generators 316 or increase gains of the power amplifiers 318 to increase the amplitudes of the electrical signals delivered to the transmission coils 314. In some cases, the frequency and the amplitude of the electrical signals for each of the transmission coils 314 can be pre-specified (during, e.g., manufacturing). The associated signal generator 316 and the associated power amplifier 318 for each of the transmission coils 314 can be set to achieve the pre-specified frequency and amplitude. The power amplifiers 318 can each be set such that the transmitter magnetic field 304 at a given point have similar amplitudes in all three dimensions.

Generally, the signals generated by each of the signal generators 316 can be multiplexed such that the components of the transmitter magnetic field 304 can be distinguishable from one another. For example, the electrical signals can be multiplexed using time division multiplexing, frequency division multiplexing, and/or spread spectrum multiplexing or phase multiplexing. In one example of frequency division multiplexing, the signal generators 316 for each transmission coil 314 can generate the unamplified electrical signals 317 to have a specified frequency between, e.g., 1 kHz and 10 kHz, 10 kHz and 20 kHz or 20 kHz and 30 kHz. The frequencies can each differ from one another by, for example, 60 Hz to 500 Hz or 500 Hz to 5 kHz. The components of the transmitter magnetic field 304 generated by the transmission coils 314 have frequencies similar to those of the unamplified electrical signals 317. The frequencies can thus be selected such that noise frequencies (due to, for example, motors, inductive coils, and other electrical systems that can generated magnetic fields) fall outside of the range of the frequencies for the amplified electrical signals 315 transmitted to the transmission coils 314.

Detection and Control System

Because the transmitter magnetic field 304 varies as the robot navigates about the environment, the detection and control system 306 can detect the transmitter magnetic field 304 and use the unique signature of the three components of the transmitter magnetic field 304 at a particular location to estimate the position 308 and the orientation 310. A sensor circuit 319 of the detection and control system 306 detects the transmitter magnetic field 304 and generates or outputs detection signals 321 using sensor coils 320. The sensor circuit 319 is in communication with the controller 312. Based on the detection signals 321, the controller 312 can determine the position 308 in three dimensions (e.g., x, y, and z) and the orientation 310 in three dimensions (e.g., θ, Φ, and ψ). The sensors coils 320 of the detection and control system 306 include three separate sensor coils 320A, 320B, 320C (herein collectively referred to as sensor coils 320) that each generate a detection signal 321 in response to the transmitter magnetic field 304. Coil axes of the sensor coils 320 are linearly independent, thus allowing detection signals 321 of the three sensor coils 320 to vary independently from one another as the robot navigates about the environment. The linear independence of the axes of the sensor coils 320 further allow the sensor coils 320 to detect magnetic fields spanning all three dimensions.

For each sample, the detection and control system 306 performs several calibration and normalization operations to increase accuracy, precision, and computational efficiency of estimation of position 308 and orientation 310. In one example, the detection and control system 306 can dynamically normalize detection data 325 representing the detection signals 321 based on calibration signals generated in response to a calibration magnetic fields that are stationary relative to the detection and control system 306 (e.g., do not move relative to the detection and control system 306) to improve accuracy and precision. In another example, the detection and control system 306 dynamically adjusts the calibration magnetic field to maintain data representing the detection signals 321 used by the controller 312 within a compressed dynamic range. In a further example, the detection and control system 306 further dynamically calibrates a transfer function (e.g., a map, a mapping, or other function) between the detection signals 321 and the pose (i.e., the position 308 and the orientation 310) using signals indicative of motion to increase accuracy and precision of estimating the pose even in presence of distortions of the transmitter magnetic field 304. Each of these processes and systems are described herein.

Normalization of Detection Signals

The detection and control system 306 uses a calibration coil 322 generate a magnetic field used to normalize the detection data 325 received by the controller 312 to estimate the pose of the robot. The detection and control system 306 or the position determination circuit thereof is thus configured to perform a self-calibration based on data representing a calibration magnetic field as sensed by a magnetic field receiver (e.g., the sensor coils 320). By calibrating the detection data 325 to a similar calibration value, the detection and control system 306 can allow changes in the detection signals 321 of similar magnitude for each of the sensor coils 320 to indicate similar changes in estimations of the position 308 and the orientation 310. The normalization of the detection data 325 can improve accuracy and precision of outputs of each of the sensor coils 320 relative to one another by the detection data 325 within a similar dynamic range.

The calibration coil 322 generates a calibration magnetic field 324 to which each of the sensor coils 320 can respond similarly. In one example, the sensor coils 320 can be positioned relative to one another and to the calibration coil 322 such that the sensor coils 320 respond similarly to the calibration magnetic field 324 generated by the calibration coil 322. The sensor coils 320 can have substantially orthogonal axes, and the calibration coil 322 can be positioned such that an axis of the calibration coil 322 forms a similar angle to the axis of each of the sensor coils 320. The angle between the axis of the calibration coil 322 and each of the sensor coils 320 can be between 50 degrees and 60 degrees. Because the sensor coils 320 form similar angles with the calibration coil 322, in response to detecting the calibration magnetic field 324, the sensors coils 320 can generate or output calibration signals 323 that are substantially similar in amplitude and frequency. By calibrating the sensor coils 320 to these calibration signals 323, the detection and control system 306 can increase accuracy and precision of estimations of the position 308 and orientation 310.

The detection and control system 306 uses the calibration magnetic field 324 to set an amount of amplification (e.g., a gain of the sensor circuit 319) of the detection signal 321 generated by each of the sensor coils 320. As described herein, the detection signals 321, after passing through amplifying, filtering, and converter circuits of the sensor circuit 319, become the detection data 325. Similarly, the calibration signals 323 become the calibration data 327 representing the calibration signals 323. Based on the calibration data 327 and on the detection data 325 that is pre-calibrated, the controller 312 can calibrate the sensor circuit 319 such that the pre-calibrated detection data 325 becomes calibrated detection data 325. After the controller 312 calibrates the sensor circuit 319 using the pre-calibrated detection data 325, the controller 312 can use the calibrated detection data 325 representing the detection signals 321 to accurately and precisely estimate the pose of the robot.

Because the calibration coil 322 does not move relative to the sensor coils 320, at different times during navigation of the robot within the environment, the amplitudes of the calibration magnetic field 324 detected by the sensor coils 320 at the different times is expected to be similar. In contrast, the amplitudes of the detection signals 321 generated by the sensor coils 320 decrease with increasing distance between the magnetic field transmitter 302 and the detection and control system 306. The controller 312 can thus normalize the detection signals 321 generated by the sensor coils 320 to the calibration magnetic field 324. Even as the robot navigates about the environment, the calibration signals 323 remain substantially similar.

Generally, the detection and control system 306 amplifies the detection signals 321 to reduce the effect of noise (e.g., from magnetic fields caused by sources other than the calibration coil 322 and the transmission coils 314). The detection and control system 306 can set a gain of the amplification based on frequencies and amplitudes of the calibration magnetic field 324. In one example, the sensor coils 320 of the sensor circuit 319 generates the detection signals 321 in response to detecting frequencies of components of the transmitter magnetic field 304. The sensor coils 320 of the sensor circuit 319 can also generate calibration signals 323 in response to detecting the frequencies of components of the calibration magnetic field 324.

The calibration magnetic field 324 may include two frequency components on either side of the frequencies of the three components of the transmitter magnetic field 304. A first frequency component has a frequency lower than the frequencies of the three components of the transmitter magnetic field 304, and a second frequency component has a frequency higher than the frequencies of the components of the transmitter magnetic field 304. As a result, the detection and control system 306 can, as described herein, amplify or attenuate the components of the transmitter magnetic field 304 by increasing or decreasing gain for frequencies bound by the first frequency component and the second frequency component. Thus, the components of the transmitter magnetic field 304, which have frequencies between a maximum magnetic field frequency (e.g., the frequency of the upper frequency component) and a minimum magnetic field frequency (e.g., the frequency of the lower frequency component), are amplified/dampened based on the relative magnitudes between the detection signals 321 and the calibration signals 323

The frequencies of the first frequency component and the second frequency components can be predetermined to select or use one of many 'channels' and receiver and transmitter can negotiate to choose least noisy channel in the environment. Exemplary channels are approximately 200 Hz to 500 Hz wide and are generally spaced in the region 1,000 Hz to 30,000 Hz. However, in some examples, the channels can be wider than 500 Hz. For example, the first frequency component can be between 500 Hz to 1 kHz, 1 to 5 kHz, or 5 kHz to 10 kHz. The second frequency component can be between 10 kHz to 15 kHz, 15 kHz to 20 kHz, 20 kHz to 30 kHz. The components of the transmitter magnetic field 304 can have frequencies as described herein such that the frequencies fall between the frequencies of the first and second frequency components.

Figure 4:
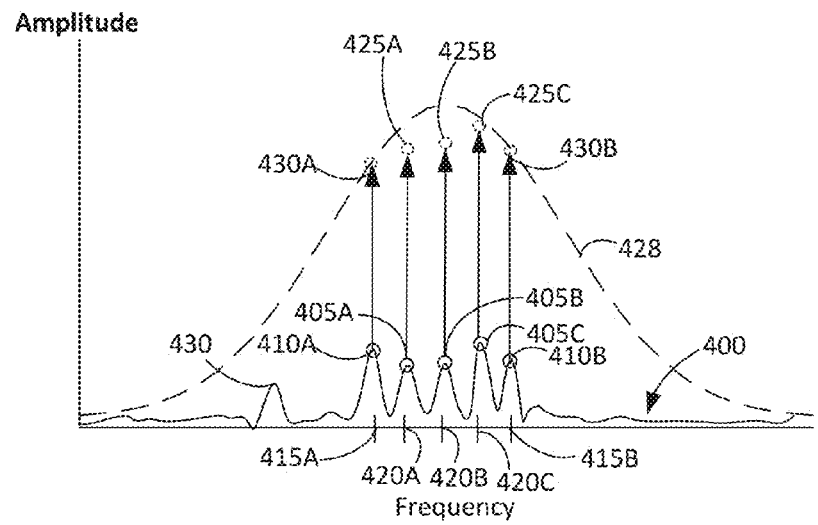
FIG. 4 is a frequency domain graph of an electrical signal generated by the detection and control system of FIG. 3.

Thus, during use, each of the coils 320 detect magnetic fields in the environment, which can include both the transmitter magnetic field 304 and the calibration magnetic field 324. FIG. 4 shows an example frequency domain graph (e.g., from a fast Fourier transform) of an electrical signal 400 generated during, for example, collection of a sample by one of the sensor coils for estimating the position and orientation of the robot. The electrical signal 400 can be example of the electrical signal, including the detection signal 321 and the calibration signal 323, generated by one of the sensor coils 320 of FIG. 3. While the electrical signal 400 is described in terms of a single electrical signal, the electrical signal 400 can also be described as a superposition of several separate electrical signals (e.g., the detection signals 321 and the calibration signals 323). In such an example, the detection responses 405A, 405B, 405C can represent the detection signals, and the calibration responses 410A, 410B can represent the calibration signals.

The electrical signal 400 generated by a sensor coil (e.g., one of the sensor coils 320) includes responses 405A, 405B, 405C to each of three components of a transmitter magnetic field (e.g., the components of the transmitter magnetic field 304 generated by the transmission coils 314A, 314B, and 314C). The electrical signal 400 further includes responses 410A, 410B to first and second frequency components of a calibration magnetic field (e.g., as described herein with respect to the calibration magnetic field 324). The calibration magnetic field and the transmitter magnetic field can thus cause the electrical signal 400 to exhibit electrical responses at five different frequencies: a calibration frequency 415A of the first frequency component of the calibration magnetic field 324, three detection frequencies 420A, 420B, 420C of the components of the transmitter magnetic field, and a calibration frequency 415B of the second frequency component of the calibration magnetic field. As shown in FIG. 4, the three detection frequencies 420A, 420B, 420C are between the calibration frequencies 415A, 415B.

The electrical signals—which each include the detection signals 321 and the calibration signals 323 generated by one of the sensor coils 320—that are transmitted through the sensor circuit 319, which includes an automatic gain control (AGC) circuit 326A, 326B, 326C (herein collectively referred to as AGC circuits 326), an amplifier circuit 328A, 328B, 328C (herein collectively referred to as amplifier circuits 328), and a filter circuit 330A, 330B, 330C (herein collectively referred to as filter circuits 330) associated with each of the sensor coils 320A, 320B, 320C. Generally, each of the coils 320 transmit the detection signals 321 and the calibration signals 323 to the associated AGC circuit 326, which amplifies both detection signals 321 and the calibration signals 323 by an AGC gain. The associated amplifier circuit 328 amplifies the signals by a predetermined amplifier gain. The associated filter circuit 330 receives amplified detection signals and amplified calibration signals and amplifies the amplified signals around a filter frequency at a filter gain. After amplification by the AGC gain, the predetermined amplifier gain, and the filter gain, the amplified electrical signals are converted to digital signals by an associated port of an analog-to-digital converter (A/D) 332 and transmitted to the controller 312. The digitized amplified electrical signals thus include the detection data 325 representing the detection signals 321 and calibration data 327 representing the calibration signals 323 for the controller 312 to use to estimate the position 308 and the orientation 310. The sensor circuit 319 can include additional steps of amplification or attenuation to further reduce dynamic ranges of the data representing the detection signals 321 and thus dynamic range requirements of the controller 312.

The controller 312 calibrates the sensor circuit 319 using an amplification feedback loop 334 and an attenuation feedback loop 336 to further reduce the dynamic range of the detection data 325. The feedback loops 334, 336 each include the calibration data 327 and also include a digital-to-analog converter (D/A) 337 to convert digital signals to analog signals that the sensor circuit 319 and an attenuator circuit 338 can use. The amplification feedback loop 334 can set a sensor circuit gain (e.g., the filter gain) of the electrical signals 321, 323 for each of the sensor coils 320 based on the calibration data 327 and the detection data 325. The attenuation feedback loop 336 can set an attenuator loss of the attenuator circuit 338 based on the detection data 325 and the calibration data 327. The attenuator circuit 338 and its attenuator loss determine an amplitude of the calibration magnetic field 324.

In one example, the controller 312 determines a difference in amplitude of the detection data 325 and the calibration data 327 to set the attenuator loss and the filter gain. Now referring also to FIG. 4, for each electrical signal 400, the controller 312 sets the filter gain of the filter circuit 330 and the attenuator loss of the attenuator circuit 338 using the amplification feedback loop 334 and the attenuation feedback loop 336, respectively, so that amplified detection responses 425A, 425B, 425C have similar amplitudes as amplified calibration responses 430A, 430B. To calibrate the sensor circuit 319, the controller 312 sets the filter gain by determining coefficients for the filter circuit 330. The controller 312 can then apply the coefficients to the filter circuit 330 to normalize a difference in gains of frequency channels corresponding to the different frequencies detected by the sensor coils 320. The controller computes an average of the amplitudes of the amplified detection responses 425A, 425B, 425C. The controller 312 also computes an average of the amplitudes of the amplified calibration responses 430A, 430B. Based on the average of the amplitudes of the amplified detection responses 425A, 425B, 425C, the controller 312 sets the filter gain for the filter circuit 330 such that the amplified detection responses 425A, 425B. 425C fall within a predetermined range of amplitudes. For example, the predetermined range can be between 0.1 and 1 microamp, 1 microamp and 10 microamps, or 10 microamps and 100 microamps. In general, the range is largely dependent on the coil size and will vary based on the construction of the coils.

The filter circuit 330 can have a filtering shape 428 that have greatest gain for frequencies between the frequencies 415A, 415B. Because the electrical signal 400 can also include a noise response 430, the frequencies of the responses 405A, 405B, 405C, 410A, and 410B can be selected so that frequency of the noise response 430 generally occurs outside of the frequencies of interest for the detection signals and the calibration signals. The filter gain can thus amplify the data representing the detection signals (e.g., the responses 405A, 405B, and 405C) more than noise response 430, which has a frequency that falls outside of the range defined by the responses 410A, 410B. The noise response 430 can be due to, for example, a motor, an inductive coil, or other electrical device that can generate a noise magnetic field. The filter circuit 330 can thus be a band-pass filter that has increased gain in a narrow band defined by the responses 405A, 405B and decreased gain for frequencies outside of the narrow band. The size of the band can be, for example, 50 Hz to 500 Hz, 500 Hz to 5 kHz, 5 kHz to 20 kHz. In some examples, the can be tunable and the shape of the frequency response can be adjusted.

Adjustment of Calibration Magnetic Field

The controller 312 can dynamically adjust the calibration magnetic field 324 to facilitate maintaining the data 325 representing the detection signals 321 within a compressed dynamic range. The controller 312 can be operable with a memory storage element that includes attenuator losses for the calibration coil 322 and corresponding static calibration transfer functions between the pose and the amplitudes of the amplified detection responses 425A, 425B, 425C (e.g., a map or mapping between the pose and the detection signals). The static calibration transfer functions can be determined and stored in the memory storage element during, for example, manufacturing of the robot. When the controller 312 selects a new attenuator loss to maintain the ratio or difference between the predetermined ranges, the controller 312 estimates the position 308 and the orientation 310 based on the new static calibration transfer functions. By dynamically changing the attenuator loss and the filter gain, the controller 312 can maintain the data representing the detection signals 321 within a compressed dynamic range, thus reducing computational power required by the controller 312 to process the data representing the detection signals 321 generated by the sensors coils 320.

Referring back to FIG. 4, based on the average of the amplitudes of the amplified detection responses 425A, 425B, 425C and the average of the amplitudes of the amplified calibration responses 430A, 430B, the controller 312 can set the attenuator loss of the attenuator circuit 338 such that the ratio between the two averages are within a predetermined range. For example, the controller 312 can set the loss to maintain the ratio of the average of the amplitudes of the amplified detection responses 425A, 425B, 425C to the average of the amplitudes of the amplified calibration responses 430A, 430B between 0.95 and 1.05, 0.9 and 1.1, and 0.85 and 1.15. In some cases, instead of computing the ratio, the controller 312 computes a difference between the averages and compares the difference to a threshold. In some cases, the controller 312 can maintain the difference to be between 0.01 and 0.1 microamps, 0.1 and 1 micro amps, and 1 and 10 microamps. In other cases, the controller 312 monitors a gain of the AGC circuit 326 and sets the attenuator loss to maintain the gain of the AGC circuit 326 between a maximum or minimum value or the gain of the AGC circuit 326. When the ratio or difference falls outside of the predetermined ranges, the controller 312 can select a new attenuator loss and a corresponding transfer function to restore the ratio or difference to be within the predetermined ranges.

Using the calibration methods described herein, the controller 312 has been described to compute an average of the detection responses 425A, 425B, 425C. In other implementations, the controller can compute a minimum, a maximum, or other metric that describes the amplitudes. The controller 312 can also compute a minimum, a maximum, or other metric describing the amplitudes of the responses 410A, 410B to the calibration magnetic field 324. The controller 312 can then compare the minimum, maximum, or other metric to threshold values to set the attenuator loss and/or the filter gain.

The calibration methods have also been described to be used to adjust the filter gain. In other examples, based on the calibration data 327 representing the calibration signals 323 and the detection data 325 representing the detection signals 321, the controller 312 can additionally or alternatively determine an amplifier gain of a programmable gain amplifier (PGA) circuit in the sensor circuit 319. The controller 312 can determine the amplifier gain of the PGA circuit based on detection data 325 and the calibration data 327. The controller 312 can then apply the amplifier gain to the PGA circuit to enable dynamic changes to amplitudes of the detection signals 321 and the calibration signals 323.

Calibration of Transfer Function

The detection and control system 306 generally seeks to estimate the position 308 and the orientation 310 of the robot using the detection signals 321 and the transfer functions between the detection signals 321 and the pose. As described herein, the controller 312 can access the statically calibrated transfer functions that are pre-determined, for example, during manufacturing of the robot and the detection and control system 306. During use, the controller 312 can further dynamically adjust the transfer functions to improve accuracy and precision of the estimation of the pose of the robot. In some examples, the statically calibrated transfer function can be inaccurate for the transmitter magnetic field 304 at different locations in the environment due to distortions in the transmitter magnetic field 304 caused by, for example, large metallic or conductive objects. The dynamic calibration can adjust the transfer function to reduce the inaccuracies.

The transfer functions implemented by the controller 312 can be maps or mappings that allow the controller 312 to estimate the pose of the robot based on characteristics of the detection signals 321. The transfer functions can be an expected position and orientation of the robot for a detected amplitude and phase of the transmitter magnetic field 304. For example, based on amplitudes of the detection signals 321, the controller 312 can compute the position 308. Based on phases of the detection signals 321, the controller 312 can compute the orientation 310. The sensor coils 320 generate the detection signals 321 in response to the transmitter magnetic field 304. The controller 312 can thus estimate the pose of the robot based on detecting the transmitter magnetic field 304 and using the transfer functions.

To achieve the dynamic adjustment or calibration of the transfer function, the detection and control system 306 can include a movement sensor 340 that generates movement signals 342. The movement sensor 340 is a movement detector that generates the movement signals 342, which be indicative of at least one of a distance traveled by the robot, a speed of the robot, or an acceleration of the robot. The movement sensor 340 can also detect relative rotations around all axes (e.g. an IMU). The A/D converter 332 converts the movement signals to data 339 representing the movement signals to be used by the controller 312.

In some cases, the controller 312 can use the movement signals 342 alone to perform SLAM techniques. Based on the movement signals 342, the controller 312 can generate a map of the environment and determine, based on the data 339 representing the movement signals 342, the pose of the robot. The movement signals 342 can include data from, for example, encoders associated with a drive of the robot, an optical mouse sensor, an inertial measurement unit (IMU), an accelerometer, or a gyroscope. The data 339 of the movement signals 342 be used as dead reckoning data that the controller 312 uses to determine relative positions of the robot. Thus, as the robot navigates about the environment, the controller 312, using the movement signals 342 alone, can determine a relative position of the robot measured relative to previous positions of the robot. Accurate over relatively short distances, dead reckoning can be prone to drift errors that accumulate over time. Accumulated drift can affect both the distance computations and the heading computations.

As described herein, the detection and control system 306 can estimate the position 308 and the orientation 310 of the robot relative to the position and orientation of the magnetic field transmitter 302. The detection and control system 306 can thus advantageously measure the position 308 and the orientation 310 for one sample collected and processed by the detection and control system 306 without referencing previous samples collected and processed by the detection and control system 306 (e.g., in contrast to the SLAM techniques described herein with respect to the movement signals 342 that computes the position and the orientation of a sample with respect to previous samples).

To improve the accuracy of the transfer functions that allow the controller 312 to estimate the position 308 and the orientation 310 from the detection signals 321, the controller 312 can use the relative positions estimated by the movement signals to modify the transfer functions. As the robot navigates about the environment, for each sample, the controller 312 can compare the relative position and orientation estimated by the movement signals 342 to the position 308 and orientation 310 determined with respect to the detection signals 321.

Figure 5:
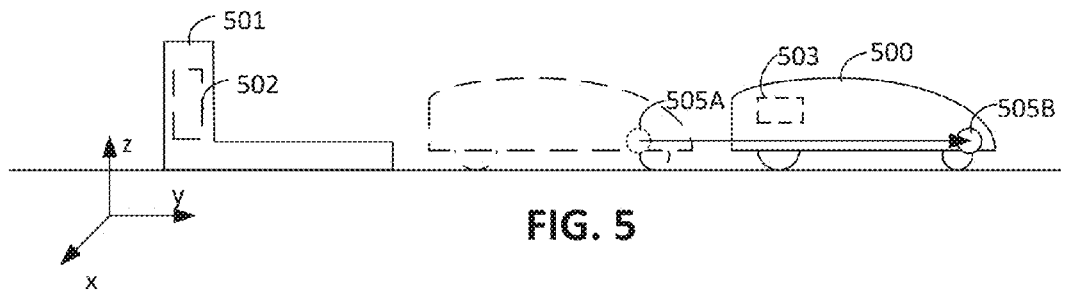
FIG. 5 is a side view of a robot navigating away from a docking station including a magnetic field transmitter.

In one example, the controller 312 can compute a relative position and orientation from the estimated positions 308 and orientations 310—which are estimated using the detection signals 321—at two separate samples. FIG. 5 shows a robot 500 moving in one-dimension (in the y-direction) away from a docking station 501 including a magnetic field transmitter 502 (e.g., the magnetic field transmitter 302 of FIG. 3) at positions 505A, 505B. The positions 505A, 505B correspond to two consecutive samples of the data representing a detection signal (e.g., the data 325 representing the detection signals 321 generated by one of the sensor coils 320) for the one dimension (e.g., the y-dimension).

As shown in FIG. 5, the robot 500, which includes a magnetic field receiver 503, is not physically tethered to (i.e., disconnected from) the docking station 501 and thus the magnetic field transmitter 502. Generally, to perform the methods and operations described herein, the robot 500 need not be tethered electrically or mechanically to the magnetic field transmitter 502 or to a structure, such as the docking station 501, containing the magnetic field transmitter 502.

Figure 6:
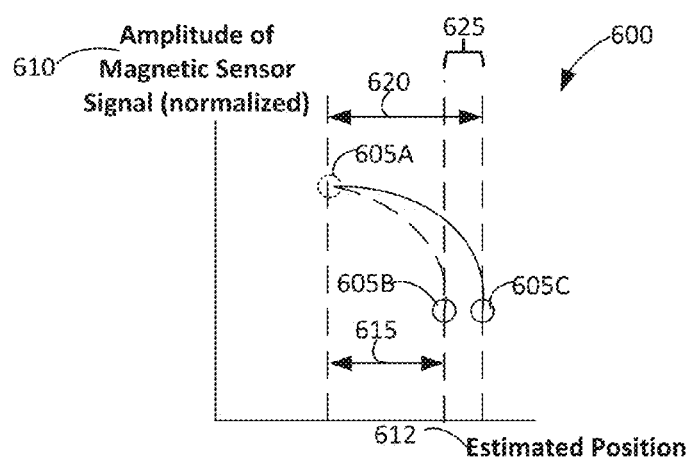
FIG. 6 is a graph of two samples collected at different poses of the robot of FIG. 5.

FIG. 6 shows a graph 600 of the data representing the detection signal (e.g., the detection signals 321) from two samples. The data representing the detection signal is generated using a detection and control system (e.g., the detection and control system 306) and includes a first sample 605A corresponding to the first position 505A and an uncalibrated sample 605B and a calibrated sample 605C both corresponding to the second position 505B. The uncalibrated sample 605B corresponds to the data representing the detection signal before modification of a transfer function between amplitude of the detection signal and position of the robot. The calibrated sample 605C corresponds to the data representing the detection signal after modifying the transfer function based on movement signals.

As shown in FIG. 6, an amplitude 610 of the data representing the detection signal decreases from the first sample 605A to a second sample (e.g., the uncalibrated sample 605B or the calibrated sample 605C), thus indicating that the second position 505B is farther from the magnetic field transmitter 502 than the first position 505A. Using the uncalibrated sample 605B and an uncalibrated transfer function between the amplitude 610 and a position 612, the controller can estimate a relative distance traveled 615 between the first position 505A and the second position 505B. Similarly, using movement signals (e.g., the movement signals 342 of FIG. 3), the controller can estimate a relative distance traveled 620.

By comparing the relative distances traveled 615, 620 estimated from the uncalibrated sample 605B and from the movement signals, the controller can determine a difference 625 between the relative distances traveled 615, 620. The controller can calibrate the uncalibrated transfer function such that the relative distance traveled estimated from the second sample matches with the relative distance traveled 620 estimated from the movement signals. As a result, after the controller calibrates the uncalibrated transfer function, the calibrated transfer function results in the calibrated sample 605C that estimates a relative distance traveled to be similar to the relative distance traveled 620 from the movement signals. The controller, by calibrating the transfer function, thus modifies the transfer function such that expected positions and orientations corresponding to amplitudes and phases of the transmitter magnetic field, respectively are more accurate. Now, referring back to FIG. 3, by calibrating the transfer function to the movement signals 342, the controller 312 can more accurately estimate the position 308 and orientation 310 of the robot within the environment.

The calibration methods described with respect to FIG. 6 can reduce errors in estimated position and orientation associated with distortions in the transmitter magnetic field (e.g., the distortion 206 of FIG. 2). In one example, as the controller 312 navigates about the environment, the controller 312 modifies transfer functions that output expected positions and orientations of the robot for corresponding amplitudes and phases of the transmitter magnetic field 304. The controller 312 can store the transfer functions on the memory storage element operable with the controller 312. When the robot approaches a distortion of the transmitter magnetic field 304, the controller 312 can use the transfer functions to estimate the position 308 and the orientation 310 of the robot relative to position and orientation the magnetic field transmitter 302 and estimate the relative position and the relative orientation using the movement signals 342. Based on the movement signals 342, the controller 312 can determine the presence of the distortion and also calibrate the transfer functions between the amplitudes of the data representing the detection signals 321 and the position 308 and the transfer functions between the phases of the data representing the detection signal 321 and the orientation 310.

As a general topography of the transmitter magnetic field 304 changes due to the distortions, the distortions can serve as re-localization features for the controller 312. When the robot encounters the distortion that causes the controller 312 to adjust the transfer functions described herein, the controller 312 can indicate on a virtual map the presence of the distortion by marking the virtual map to have a feature corresponding to the distortion. The virtual map can denote the amplitudes of the components of the transmitter magnetic field 304 at different positions throughout the environment. Additionally or alternatively, the virtual map can denote the phases of the components of the transmitter magnetic field 304 at different orientations throughout the environment.

The feature encountered by the robot can include unique magnetic field characteristics over a geometric profile. The magnetic field characteristics can include phases and amplitudes of the data representing the detection signals 321 that the controller 312 at the various locations and orientations along the geometric profile. The controller 312 can learn the feature such that, in a subsequent operation in which the robot encounters the feature, the robot can estimate the location of the feature in the subsequent operation and compare the estimated location of the feature in the subsequent operation to the location of the feature in the previous operation. Based on the difference between the two estimates, the controller 312 can perform re-localization to re-orient or reposition the virtual map stored on the memory storage element so that the estimated locations match one another. The controller 312 can thus reduce error in the estimates of the pose by re-localizing to distortions. Detailed methods of re-localization are described in U.S. patent application Ser. No. 13/790,643, filed on Mar. 8, 2013, and titled "Simultaneous Localization and Mapping for a Mobile Robot," which is herein incorporated by reference in its entirety.

While the example described with respect to FIG. 6 shows a single dimension, the calibration and re-localization methods described herein can be applied to calibrating positions and orientations in three dimensions (the x-, y-, and z-dimensions). For example, the controller 312 can perform a fast Fourier transform using the data representing the detection signals 321 to obtain a phase and an amplitude of detection signals 321. The controller 312 can determine an orientation of the robot based on the phase. The controller 312 can determine a drift of the phase between a first sample and a second sample to detect changes in relative orientations of the transmission coils 314 and the sensor coils 320. The controller 312 can further calibrate and compare the estimates of the orientation 310 to the estimates of the relative orientation from the movement signals 342.

The calibration methods can also be used to resolve hemispherical ambiguities due to detection signals 321 that can indicate multiple estimated positions 308 and multiple estimated orientations 310. The hemispherical ambiguities may occur due to symmetry of the transmitter magnetic field 304 in the environment. For example, as shown in FIG. 7, using the transfer functions described herein, a controller (e.g., the controller 312) of a robot can estimate that its pose is one of multiple possible poses, such as a first pose 700 or a second pose 705, based on the data representing the detection signals. The robot estimates its pose by detecting a transmitter magnetic field 710 generated by a magnetic field transmitter 715 (e.g., the magnetic field transmitter 302 of FIG. 3). The controller can select between the first pose 700 and the second pose 705 by monitoring movement signals (e.g., the movement signals 342). In one example, if the controller determines from the movement signals that the robot is moving away from the magnetic field transmitter 715, then the controller can determine that the robot has the first pose 700. If the controller determines from the movement signals that the robot is moving toward the magnetic field transmitter 715, then the controller can determine that the robot has the second pose 705. Thus, the movement signals can further allow the controller to resolve hemispherical ambiguities caused as a result of symmetry of the transmitter magnetic field 710 generated by the magnetic field transmitter 715.

Structure of Transmitter and Receiver

Structures of a magnetic field transmitter (e.g., the magnetic field transmitter 302) and a detection and control system (e.g., the detection and control system 306) can further improve accuracy and precision of estimations of the position 308 and the orientation 310 of the robot. FIG. 8 shows an example magnetic field transmitter 800 that includes three transmission coils 802A, 802B, 802C and electrical circuitry 804. As described herein, the electrical circuitry 804 can modulate amplitudes, frequencies, and other characteristics of electrical signals transmitted to the transmission coils 802A, 802B, 802C. The electric circuitry 804 can thus set amplitudes and frequencies of a transmitter magnetic field emitted by the transmission coils 802A, 802B, 802C.

The transmission coils 802A, 802B, 802C are arranged to approximate at least part of an outline of a sphere. Arranging the coils 802A, 802B, 802C in the spherical arrangement simplifies equalizing areas of each of the coils 802A, 802B, 802C. Equalized areas can simplify processing required for estimating the pose of the robot. For example, the diameter of the sphere can be between 10 centimeters and 20 centimeters, 20 centimeters and 25 centimeters, and 25 centimeters and 30 centimeters. As a result, the coils 802A, 802B, 802C can be arranged about the sphere to have such diameters as well.

Furthermore, arranging the coils 802A, 802B, 802C in the spherical arrangement about great circles (the largest circular cross-sectional areas) of the sphere increases the linear independence of the axes of the coils 802A, 802B, 802C. As described herein, the axes of the coils 802A, 802B, 802C can be arranged such that they are mutually orthogonal and span three dimensions. The spherical arrangement allows the coils 802A, 802B, 802C to be easily arranged such that the axes intersect at or near a common point, thus increasing the linear independence of components of the transmitter magnetic field generated by each of the coils 802A, 802B, 802C.

A detection and control system 900 (e.g., the detection and control system 306), as shown in FIG. 9, can also have a spherical arrangement of sensor coils 902A, 902B, 902C. As described herein, the detection and control system 900 can include circuitry 904 to receive electrical signals generated by the sensor coils 902A, 902B, 902C and then determine an orientation and position of the detection and control system 900 relative to a magnetic field transmitter (e.g., the magnetic field transmitter 800).

The sensor coils 902A, 902B, 902C are arranged to approximate at least part of an outline of a sphere. Arranging the coils 902A, 902B, 902C in the spherical arrangement simplifies equalizing areas of each of the coils 902A, 902B, 902C. Equalized areas can simplify processing required for estimating the pose of the robot. The coils 902A, 902B, 902C, by having similar areas, can respond similarly to changes in the magnetic field. For example, the diameter of the sphere can be between 2 centimeters and 7 centimeters, 7 centimeters and 15 centimeters, and 15 centimeters and 20 centimeters. As a result, the coils 902A, 902B, 902C can be arranged about the sphere to have such diameters as well. The ratio of the diameters of the transmission coils 802A, 802B, 802C to the diameters of the sensor coils 902A, 902B, 902C can be between, for example, 1.2 and 2, 2 and 3, 3 or 4, or more. As the ratio increases, the accuracy and precision of the estimated position and orientation increases.

Furthermore, arranging the sensor coils 902A, 902B, 902C in the spherical arrangement about great circles (the largest circular cross-sectional areas) of the sphere increases the linear independence of the axes of the coils 902A, 902B. 902C. As described herein, the axes of the coils 902A, 902B, 902C can be arranged such that they are mutually orthogonal and span three dimensions. The spherical arrangement allows the coils 902A, 902B, 902C to be easily arranged such that the axes intersect at or near a common point, thus improving the linear independence of components of the transmitter magnetic field generated by each of the coils 902A, 902B, 902C. An axis of a calibration coil 906 that intersects a center of the sphere can be easily positioned to form an equal angle with the axes of the coils 902A, 902B, 902C, thus improving precision and accuracy of the calibration methods described herein.

Example Robot

Figure 10:
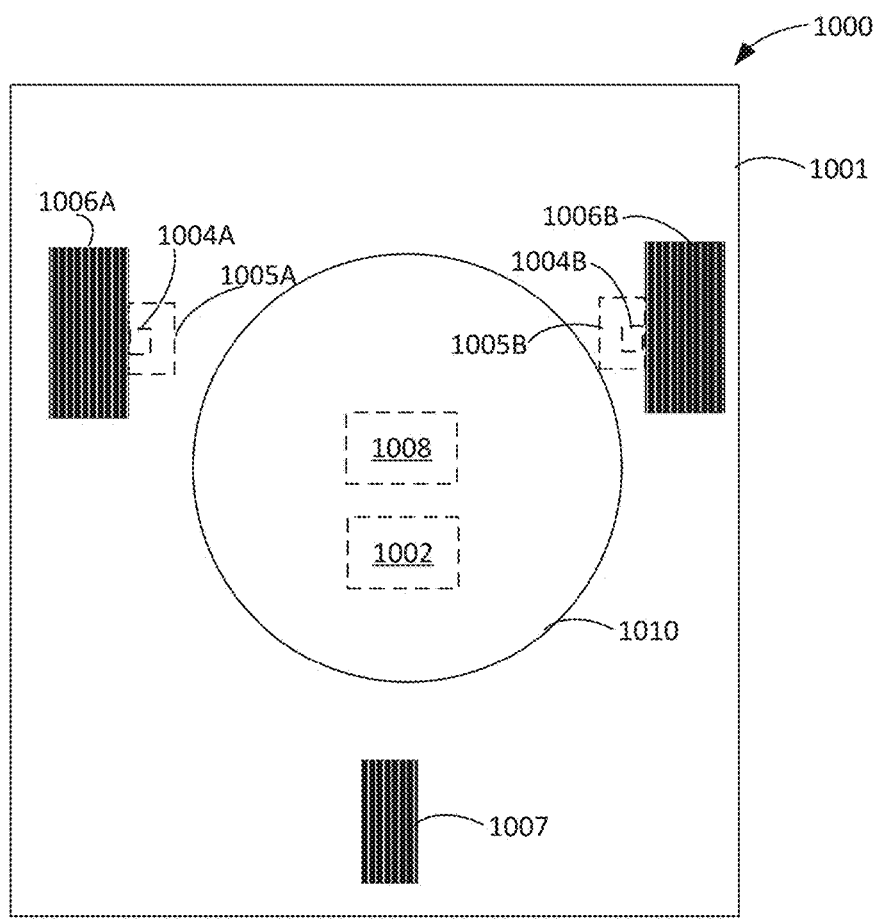
FIG. 10 is a bottom view of a robot including a detection and control system.

The detection and control systems described herein can be implemented into robots that can perform various functions in various environments. In one example shown in FIG. 10, which shows a bottom view of a robot 1000, the robot 1000, which can perform a cleaning, mowing, or other robotic operation as the robot 1000 navigates about a surface in an environment, can include a body 1001. For a robotic lawnmower, the surface can be a lawn. For a cleaning robot, the surface can be a floor.

The body 1001 of the robot 1000 houses a detection and control system 1002 (e.g., the detection and control system 306) that can detect a position and orientation of the robot 1000 relative to a magnetic field transceiver. As described herein, the detection and control system 1002 can include a controller, a magnetic field receiver, a sensor circuit, and other appropriate systems to facilitate precise, accurate, and efficient estimation of the position and orientation of the robot based on a transmitter magnetic field generated by the magnetic field transceiver.

To perform the calibration methods described herein, the robot 1000 can include movement sensors operable with or included as part of the detection and control system 1002. The detection and control system 1002 can receive signals from the movement sensors so that the detection and control system 1002 (e.g., a controller of the detection and control system 1002) can estimate an acceleration, velocity, or pose of the robot 1000. These movement sensors can include encoders 1004A, 1004B operable with motors 1005A, 1005B for drive wheels 1006A, 1006B so that the detection and control system 1002 can estimate a relative distance traveled by the robot 1000. The movement sensors can also include an IMU 1008 (e.g., an accelerometer and a gyroscope) so that the detection and control system 1002 can estimate an acceleration, velocity, and relative pose of the robot 1000. Wheels 1006A. 1006B and caster wheel 1007 support the body 1001 as the robot 1000 moves about the surface of the environment.

The motors 1005A, 1005B, which control movement of the robot 1000 about the environment, can introduce magnetic field noise that the detection and control system 1002 can detect when the robot 1000 navigates about the environment. As described herein, frequencies of a calibration magnetic field generated by a calibration coil of the detection and control system 1002 can be selected such that the magnetic field noise generally occurs outside of a range of frequencies defined by the calibration magnetic field. In some implementations, the detection and control system 1002 can control operation of the motors 1005A. 1005B based on when the detection and control system 1002 detects the transmitter magnetic field and the calibration magnetic field. During detection, the detection and control system 1002 can, for example, reduce a power transmitted to the motor or slow operation of the motors 1005A, 1005B. The magnetic field noise generated by the motors 1005A, 1005B is therefore reduced when the detection and control system 1002 is detecting the transmitter magnetic field and the calibration magnetic field to estimate the pose of the robot. Such operation of the motors 1005A, 1005B can improve accuracy of the estimated pose of the robot.

The robot 1000 includes a mechanism 1010 to execute the operation in the environment. In one example, the mechanism 1010 is a cutting mechanism including one or more blades that rotate as the robot 1000 navigates around a lawn of the environment. The detection and control system 1002 can control the cutting mechanism such that, as the robot 1000 moves across the lawn, the robot 1000 can cut the lawn using the cutting mechanism.

In another example, the mechanism 1010 is a floor cleaning mechanism that includes rollers, a suction source, a dust bin, and other appropriate components that allows the floor cleaning mechanism to ingest debris from a floor of the environment as the robot 1000 moves across the floor. The detection and control system 1002 can control the floor cleaning mechanism so that the robot 1000 can move across a floor to clean the floor.

In some implementations, the mechanism 1010 is a cleaning pad that can be moistened with a cleaning fluid from a fluid reservoir of the robot 1000. As the robot 1000 navigates about a floor of the environment, the detection and control system 1002 controls the robot 1000 to eject cleaning fluid onto the floor of the environment. The detection and control system 1002 can further control the robot 1000 to move over the cleaning fluid so that the cleaning pad absorbs the cleaning fluid. The robot 1000 can thus scrub and clean the floor of the environment using the cleaning pad.

The detection and control system 1002 can be configured to exchange information with a remote device to cause the robot 1000 to perform the operations described herein. The information can include position and orientation of the robot 1000 relative to the magnetic field transceiver. The information can also include instructions for movement across the surface of the environment, such as, as described herein, the lawn, the floor, or other surface on which the robot 1000 can perform the operations associated with the mechanism 1010. In some implementations, the environment is one or more interconnected rooms of a building, an outdoor location, field, or other appropriate environment for the mechanisms described herein.

Various robots configured to perform other functions, and with other associated mechanisms, can include the detection and control system 1002 to facilitate estimation of the position and orientation of the robot 1000 with respect to a magnetic field transmitter. Suitable robots and mechanism are further described in U.S. Publication No. 2011/0167574, filed Nov. 5, 2010, titled "Methods and systems for complete coverage of a surface by an autonomous robot," U.S. patent application Ser. No. 13/460,261, filed Apr. 30, 2012, titled "Robotic Vacuum," U.S. patent application Ser. No. 11/688,213, filed Mar. 19, 2007, titled "Robot Confinement," U.S. Provisional Patent Application Ser. No. 62/059,637 entitled "Surface Cleaning Pad" filed Oct. 3, 2014, and U.S. patent application Ser. No. 14/512,098 filed on Oct. 10, 2014 and titled "Robotic Lawn Mowing Boundary Determination," the disclosures of which are incorporated by reference herein in their entireties.

Example Navigation Process

Figure 11:
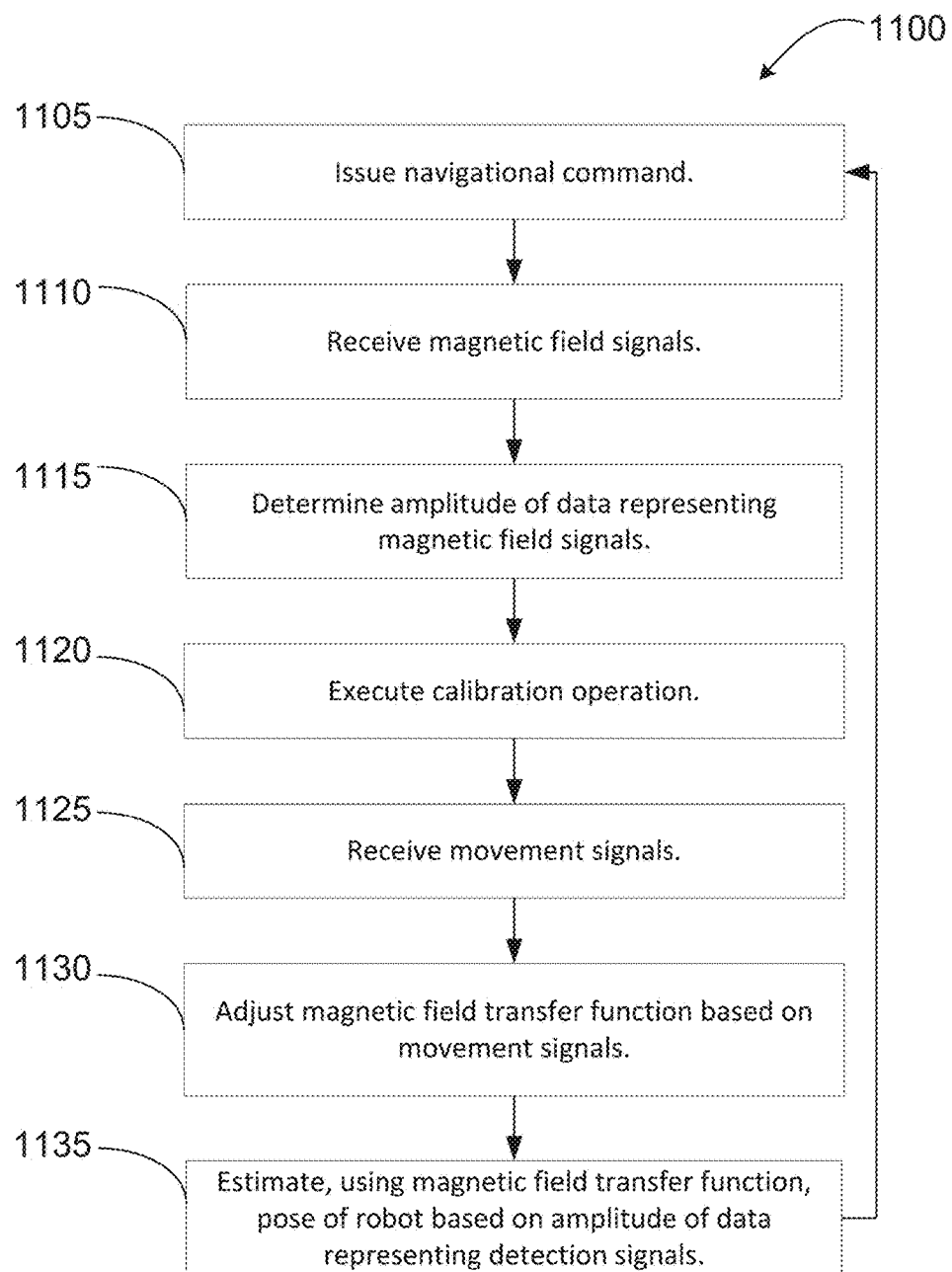
FIG. 11 is a flow chart showing a process implemented by a mobile robot to estimate a position and orientation of the mobile robot.

FIG. 11 shows a flow chart of a process 1100 to estimate a pose of a robot using magnetic fields generated by, for example, a magnetic field transmitter. At operation 1105, a controller of the robot issues a navigational command. The navigational command can include instructions for the robot to activate a drive mechanism to move and navigate about the environment. The navigational command can also include reducing power for a motor of the robot to reduce noise associated with the motor. The navigational command can be based on data generated from a detection and control system of the robot.

At operation 1110, the controller of the robot receives magnetic field signals generated by, for example a sensor coils responsive to magnetic fields. The magnetic field signals are electrical signals generated in response to magnetic fields in the environment. The magnetic field signals can include detection signals generated in response to a transmitter magnetic field from the magnetic field transmitter. The magnetic field signals can also include calibration signals generated in response to calibration magnetic fields from a calibration coil. The robot can include a detection and control system (e.g., the detection and control system 306 discussed above) that includes sensor coils, the calibration coil, and the controller. The calibration magnetic field can include a first frequency component and a second frequency component, as described herein with respect to FIG. 4. The transmitter magnetic field can have components with frequencies between the frequencies of the calibration magnetic field. The magnetic field can include noise magnetic fields that are emitted from neither the detection and control system nor the magnetic field transmitter. Before the controller receives the magnetic field signals, the controller can reduce power to a devices that induce noise magnetic field to reduce amplitudes of the noise magnetic fields.

At operation 1115, the controller determines an amplitude of data representing the magnetic field signals. The controller can determine amplitudes of data representing the detection signals and amplitudes of data representing the calibration signals. The controller can additionally determine phases and frequencies of the data representing the magnetic field signals. As described herein, the data representing the magnetic field signals (e.g., the detection data 325 and the calibration data 327 of FIG. 3) can be generated using amplifying, filtering, and digitizing circuitry as described with respect to FIG. 3.

At operation 1120, the controller executes a calibration operation that, for example, normalizes the data representing the magnetic field signals. For example, the controller can execute the calibration and normalization operation described with respect to the calibration coil 322 of FIG. 3. The controller can calibrate and normalize amplitudes, phases, frequencies, and other characteristics of the data representing the magnetic field signals. In one example, when the controller executes the calibration operation of the operation 1120, the controller executes a process 1200 shown in FIG. 12.

Figure 12:
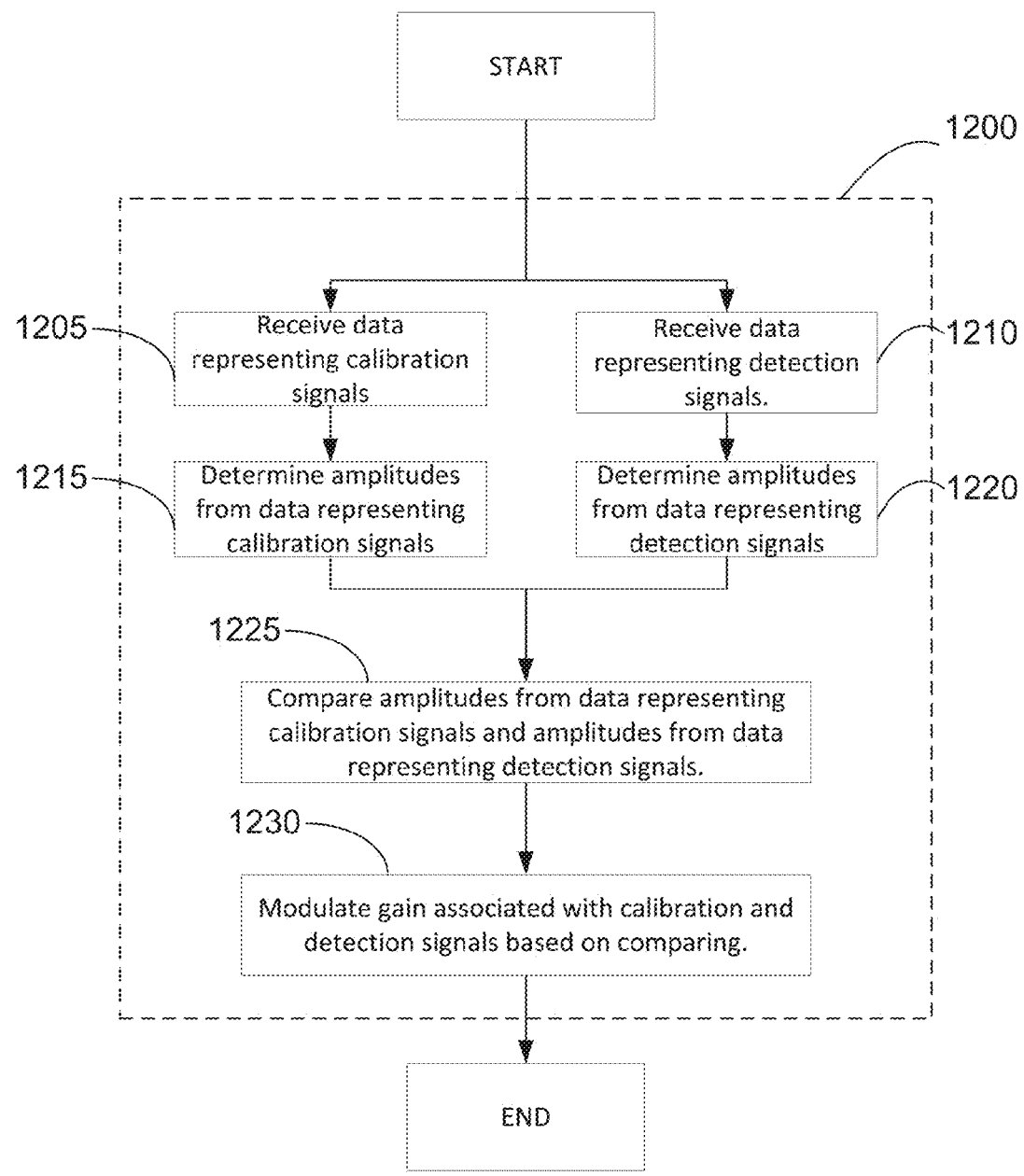
FIG. 12 is a flow chart showing a process implemented by a mobile robot to adjust a gain of a detection and control system.

Referring to FIG. 12, the controller executes the process 1200 to normalize the detection signals to the calibration signals, thus reducing a dynamic range of the detection signals. The process 1200 can normalize amplitudes, frequencies, phases, or other characteristics of the detection signals.

At operation 1205, the controller receives data representing the calibration signals (e.g., the calibration data 327 of FIG. 3). At operation 1210, which occurs at the same time as the operation 1205, the controller receives data representing the detection signals (e.g., the detection data 325 of FIG. 3). The data representing the calibration signals and the data representing the detection signals can be generated by transmitting the calibration signals and the detection signals through amplification, filtering, and digitizing circuitry of the detection and control system.

The controller then, at operations 1215 and 1220, determines amplitudes from the data representing the calibration signals and from the data representing the detection signals. In some cases, the controller additionally or alternatively determines phases, frequencies, and other parameters associated with the data.

At operation 1225, the controller compares the amplitudes from data representing calibration signals and the amplitudes from data representing detection signals. As described herein, the controller can compare averages, minimum, maximum, and other measures of the amplitudes. During the comparison, the controller can compute a difference between the amplitudes and compare the difference between the amplitudes to a threshold difference. The controller can compare the difference to a range of appropriate differences.

At operation 1230, based on the comparison, the controller modulates a gain associated with the calibration and detection signals. For example, the controller can control a gain of a filter circuit, a PGA circuit or other amplification circuit that amplifies the calibration and detection signals. The controller can modulate the gain such that the detection signals typically are maintained within a predetermined range. By executing the process 1200, the controller can thus reduce a dynamic range of the data presenting the detection signals.

Referring back to FIG. 11, the controller receives movement signals at operation 1125. The movement signals can be indicative of at least one of a distance traveled by the robot, a speed of the robot, or an acceleration of the robot. The movement signals can be generated by, for example, an optical mouse sensor, an IMU, an accelerometer, a gyroscope, an encoder, or other appropriate detector. The movement signals can be used for a dead reckoning operation to estimate relative positions and orientations of the robot.

At operation 1130, the controller adjusts a magnetic field transfer function based on the received movement signals. The magnetic field transfer function can define a relationship between the detection signals and a position and orientation (e.g., a pose) of the robot. When the controller is initialized, the magnetic field transfer function can be loaded on a memory storage element operable with the controller. In that example, the magnetic field transfer function is initially a static calibration that can be set during manufacturing of the robot. The controller can then adjust the initial magnetic field transfer function based on the movement signals. Examples of the methods and operations that can be implemented during the operation 1130 are described in more detail with respect to FIG. 3.

At operation 1135, the controller estimates, using the magnetic field transfer function, a pose of robot based on the amplitude of the data representing detection signals. The pose includes position and orientation relative to the magnetic field transmitter. In some cases, the controller stores the pose in a map stored on a memory storage element operable with the controller. The map can be used for SLAM methods as described herein.

Various operations of the process 1100 can occur sequentially or simultaneously. For example, in some implementations, for each data collection sample, the controller receives the magnetic field signals and the movement signals at substantially the same time. The controller can then sequentially determine the amplitude of data representing magnetic field signals, execute the calibration operation, adjust magnetic field transfer function based on the movement signals, and estimate, using the magnetic field transfer function, the pose of robot based on the amplitude of data representing the detection signals.

In some implementations, the controller can skip operations 1130 and 1135 and use a predetermined magnetic field transfer function. The magnetic field transfer function can be, for example, stored on the memory storage element during manufacturing of the robot.

Structures of a magnetic field transmitter (e.g., the magnetic field transmitter 800) and a detection and control system (e.g., the detection and control system 900) are not limited to the examples described herein of a magnetic field transmitter that includes three transmission coils and a detection and control system that includes three sensor coils. In some additional examples, the magnetic field transmitter could two transmission coils and a detection and control system could include two sensor coils. The two transmission coils. In this example, the transmitter magnetic field can be a superposition of two separate magnetic fields each corresponding to one of the components generated by the transmission coils. Based on the detection signals, the controller can determine the position in two dimensions (e.g., x, y) and the orientation in two dimensions (e.g., θ, Φ,). Such a system would be suitable for an environment consisting of a single plane or where changes in the third dimension or orientation are limited or inconsequential. Using a two-coil system rather than a three-coil system can provide the advantage of reducing the cost of the transmitter and receivers in the system.

Figure 13:
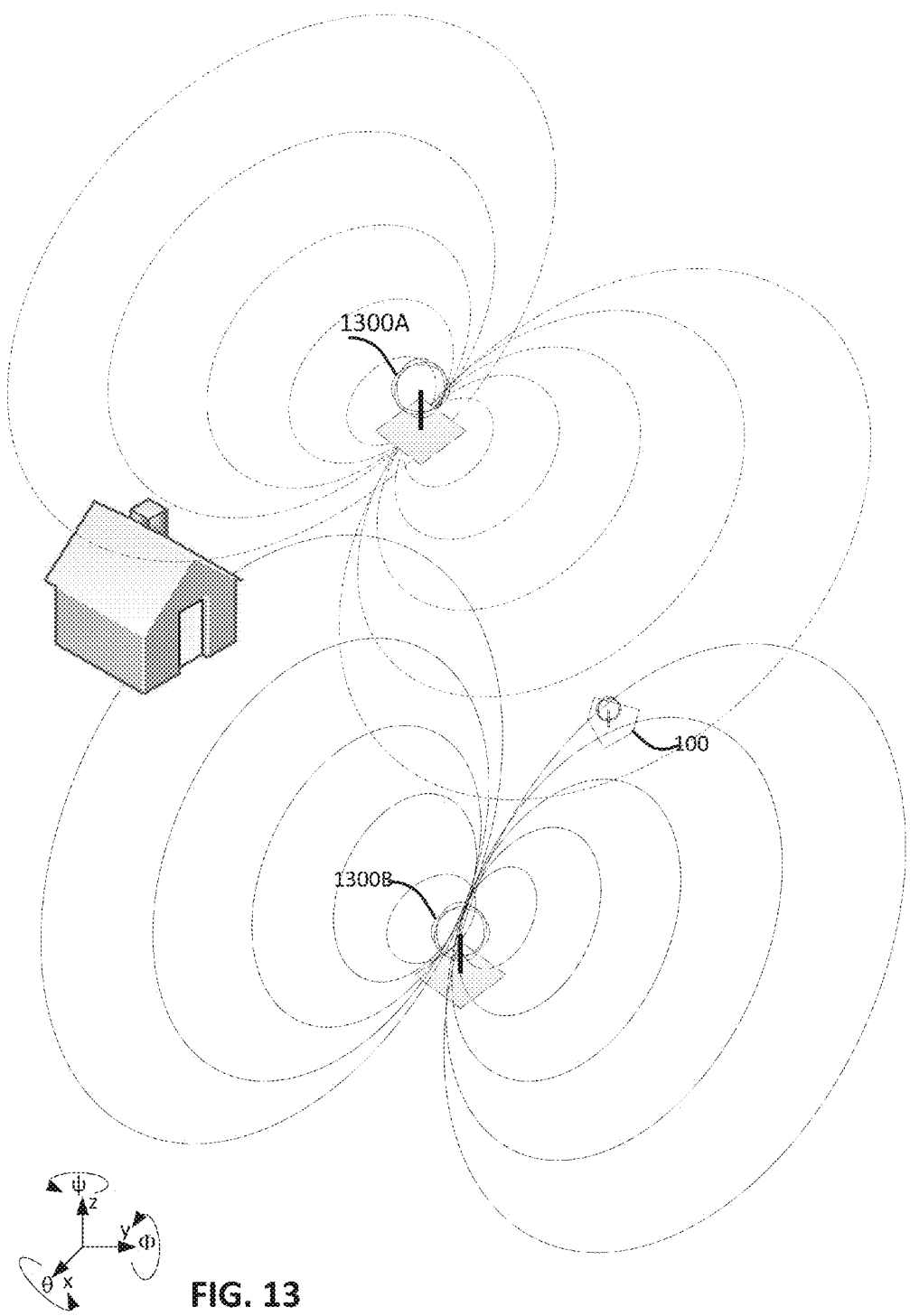
FIG. 13 is a perspective view of a robot navigating in an environment with multiple magnetic field transmitters emitting magnetic fields.

In the examples shown above, one transmitter was described as providing the magnetic field used by the detection system to localize the robot. However, the systems are not limited to a single transmitter. For example, as shown in FIG. 13, the system described herein that includes magnetic field transmitter and a detection and control system is not limited to a single magnetic field transmitter and a single detection and control system. Instead, there can be multiple magnetic field transmitters (e.g., 1300A and 1300B) and/or multiple detection and control systems. In one example, multiple magnetic field transmitters (e.g., 1300A and 1300B) can be used simultaneously to provide an extended range for the environment. In this example, the first magnetic field transmitter 1300A emits a first transmitter magnetic field and a second magnetic field transmitter 1300B can be positioned to provide a second transmitter magnetic field such that the two transmitter magnetic fields overlap and the second transmitter magnetic field becomes stronger as the first transmitter magnetic field becomes weaker. Based on the detection signals, the controller in the robot 100 can determine the position and orientation relative to the first magnetic field transmitter 1300A until the first transmitter magnetic field becomes weak (e.g., as the robot 100 moves away from the transmitter) and then switch to determine the position and orientation relative to the second magnetic field transmitter 1300B. In some examples, the robot 100 determines signal strength of the magnetic field from the first transmitter 1300A and localizes the robot using the magnetic field from transmitter 1300A when the signal strength is above a threshold. When the signal falls below the threshold, the robot 100 localizes the robot based on the signal from transmitter 1300B. If the range of the localization system were to be further increased, additional transmitters could be added (e.g., 3 transmitters, 4 transmitters). Thus, the presence of multiple transmitters extends the range and as one signal becomes weaker (e.g., signal from a first transmitter) the robot begins to see a signal from a different transmitter. As the signal from the second transmitter becomes stronger the robot will switch from localizing based on the signal from the first transmitter to localizing based on the signal from the second transmitter. There is a period of time when the robot receives a signal of sufficient strength from multiple transmitters simultaneously. The handoff for localizing can occur during a period of time when both signals are received in order to enable a smooth transition.

In another example, the measured signals from multiple magnetic field transmitters can be used simultaneously to improve position and orientation errors resulting from sensitivity to the transmit coil or sensor coil orientation or orthogonality. For example, if one transmitter is located in a docking/charging station for the robot the transmitter could potentially be rotated due to the robot contacting or bumping into the docking/charging station. The presence of another transmitter in close proximity with the first transmitter can be used to determine when such a movement or rotation has occurred. For example, the robot can determine when the field has been rotated and adjust its location determination accordingly. In some examples, the first and second magnetic field transmitters can be positioned in relatively close proximity to each other (e.g., within 1-3 meters of one another, within 2-5 meters of one another, within 4-7 meters of one another). Based on the detection signals from both magnetic field transmitters, the controller can triangulate position and orientation relative to the two transmitter magnetic fields simultaneously. Thus, two transmitters are placed such that there is significant overlap in field coverage and the signal from both transmitters can be used to increase accuracy.

The system described herein consisting of a magnetic field transmitter and a detection and control system is not limited to a stationary magnetic field transmitter and a detection and control systems implemented into a robot. Instead, in one example, the magnetic field transmitter can be implemented with the control systems into a robot and the detection system consisting of the sensor coil can be stationary. In this example, the stationary detection system is low power consuming and could be powered using a battery array or other low power source such as solar power allowing it to be positioned far from a stationary power source.

Figure 14:
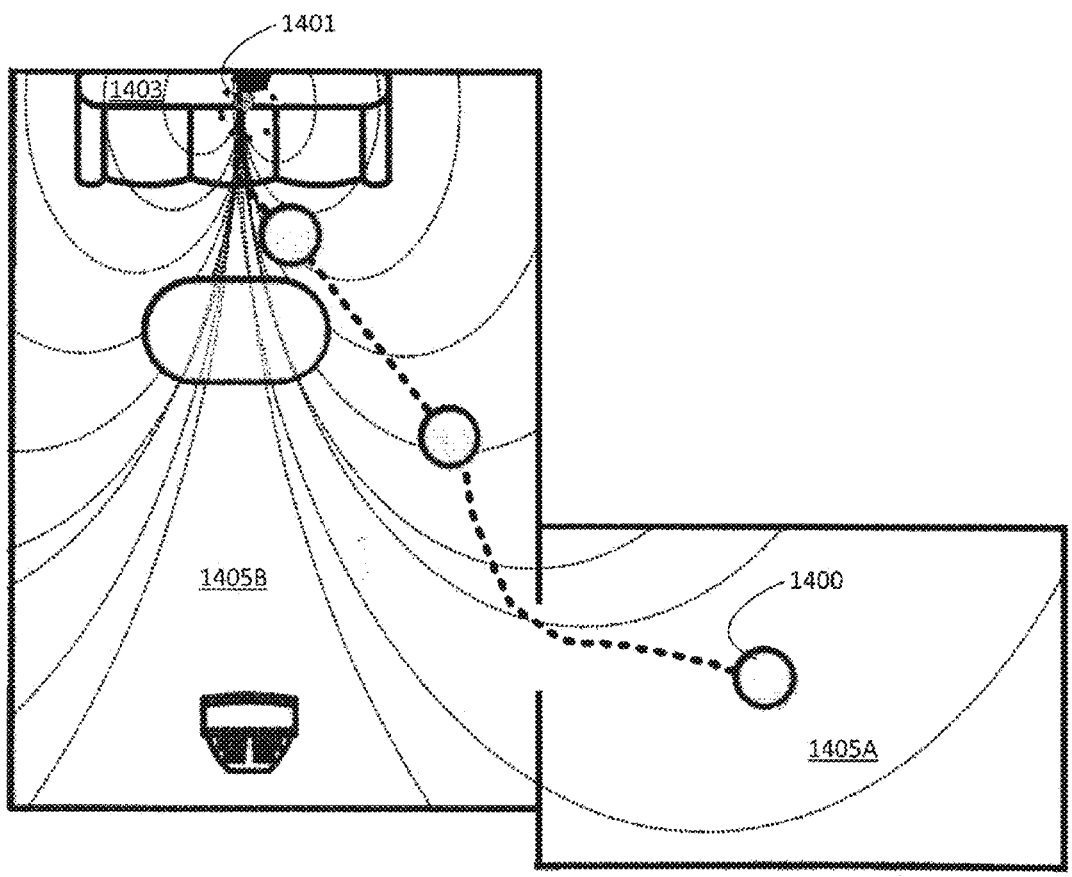
FIG. 14 is a perspective view of a robot navigating in an indoor environment with a magnetic field transmitter emitting a magnetic field.

While in at least some of the examples described herein, the magnetic field is used to localize a robot in an outdoor environment, the systems and methods described herein could additionally or alternatively be used to localize a robot indoors. For example, as shown in FIG. 14, a cleaning robot 1400 such as a vacuuming robot or a robot having a cleaning pad, home security or monitoring robot, or other robot could include a receiver configured to measure a magnetic field from a transmitter 1401 located inside the house or building. A docking station, where the robot 1400 can re-charge its power source, can include the transmitter 1401. In some examples, the transmitter could be connected directly to an outlet or be placed behind furniture 1403 (e.g., shown behind or underneath a couch) or other items. Thus, the transmitter 1401 and the docking station might be hidden from view of the casual observer by, for example, being placed beneath or behind furniture 1403. However, since the magnetic field is not obstructed by the sofa or furniture, the robot 1400 can still use the signal both to determine its location within the room(s) and to navigate to the docking station. Thus, in some examples, the signal emitted from the transmitter 1401 on the docking station and used to navigate the robot 1400 to the docking station is transmitted through at least one item of furniture (e.g., furniture 1403) during at least a portion of the docking process. Allowing the docking station to be positioned in an area accessible by the robot 1400 (e.g., under furniture having a height of between 3-10 inches, under furniture having a height that is greater than the height of the robot and less than 6 inches from the floor surface) that is not generally visible or accessible to a person can be advantageous. In addition, the magnetic field signal can pass through wood and other materials that form walls within the house. As such, the same transmitter can be used to localize the robot 1400 as the robot 1400 navigates from room 1405A to room 1405B (e.g., as shown in FIG. 14).

The robots described herein can be controlled, at least in part, using one or more computer program products, e.g., one or more computer programs tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment.

Operations associated with controlling the robots described herein can be performed by one or more programmable processors executing one or more computer programs to perform the functions described herein. Control over all or part of the robots described herein can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A mobile robot comprising:
   a movement sensor configured to detect at least one motion characteristic while the mobile robot moves over a surface within an environment;
   a calibration coil configured to produce a calibration magnetic field;
   a sensor circuit responsive to the calibration magnetic field, the sensor circuit configured to generate calibration signals based on the calibration magnetic field; and
   a controller configured to calibrate the sensor circuit as a function of the calibration signals, thereby resulting in a calibrated sensor circuit configured to detect a transmitter magnetic field within the environment,
   wherein the controller is configured to estimate a pose of the mobile robot as a function of at least the detected transmitter magnetic field and the at least one detected motion characteristic.

2. The mobile robot of claim 1, wherein the mobile robot is a robot lawnmower, the surface comprises a lawn, and the robot lawnmower further comprises a cutting mechanism, and wherein the controller is configured to exchange information with a remote device to cause the robot lawnmower to move across the lawn while cutting the lawn using the cutting mechanism, the information comprising a position of the robot lawnmower relative to a point on the lawn and instructions for movement across the lawn.

3. The mobile robot of claim 1, wherein the robot is a cleaning robot and the surface comprises a floor of a room, and wherein the controller is configured to exchange information with a remote device to cause the cleaning robot to move across the floor to clean the floor using a floor cleaning mechanism or cleaning pad of the cleaning robot, the information comprising a position of the cleaning robot in the room and instructions for movement throughout the room.

4. The mobile robot of claim 1, wherein the sensor circuit comprises a filter circuit and sensor coils responsive to the transmitter magnetic field; and the controller is configured to determine coefficients for the filter circuit based on data representing the calibration signals, and apply the coefficients to the filter circuit to normalize a difference in gains of frequency channels corresponding to different frequencies detected by the sensor coils.

5. The mobile robot of claim 1, wherein the sensor circuit comprises an amplifier circuit; and the controller is configured to determine gains of the amplifier circuit based on data representing the calibration signals, and apply the gains to the amplifier circuit to enable dynamic changes to amplitudes of the calibration signals.

6. The mobile robot of claim 1, wherein the sensor circuit comprises three sensor coils defining different coil axes and arranged to be responsive to different components of the transmitter magnetic field.

7. The mobile robot of claim 6, wherein the coil axes are orthogonal in three dimensions; and wherein the sensor coils are arranged to approximate at least part of an outline of a sphere.

8. The mobile robot of claim 1, wherein the controller is configured to calibrate the sensor circuit as a function of the calibration signals and pre-calibration data representing the transmitter magnetic field.

9. The mobile robot of claim 8, wherein the controller is configured to compare, to a threshold, a difference between an amplitude of the calibration magnetic field and an amplitude of the transmitter magnetic field, and calibrate the sensor circuit based on the difference.

10. The mobile robot of claim 1, wherein the calibrated sensor circuit is configured to detect the transmitter magnetic field by detecting frequencies of components of the transmitter magnetic field between maximum and minimum magnetic field frequencies based on an output of the calibration coil.

11. The mobile robot of claim 1, wherein the controller is configured to estimate the pose of the mobile robot by performing operations comprising determining a drift of a phase of the detected transmitter magnetic field over time to detect changes in relative orientations of transmission coils that transmit the transmitter magnetic field and sensor coils in the sensor circuit that detect the transmitter magnetic field.

12. The mobile robot of claim 1, wherein the controller is further configured to detect a distortion of the transmitter magnetic field based on the at least one motion characteristic.

13. The mobile robot of claim 1, wherein the controller is further configured to resolve an ambiguity of the estimated pose of the mobile robot in response to the at least one motion characteristic.

14. The mobile robot of claim 1, wherein the mobile robot is physically disconnected from a magnetic field transmitter configured to emit the transmitter magnetic field.

15. The mobile robot of claim 1, wherein the at least one motion characteristic is selected from the group consisting of a distance traveled, a velocity, or an acceleration.

16. An autonomous robot system comprising:
a magnetic field transmitter comprising transmitter coils configured to generate a transmitter magnetic field; and
a robot configured to autonomously maneuver about an environment relative to the magnetic field transmitter, the robot comprising:
a movement sensor configured to detect at least one motion characteristic;
a calibration coil configured to generate a calibration magnetic field;
a magnetic field receiver comprising sensor coils responsive to the transmitter magnetic field and to the calibration magnetic field; and
a position determination circuit configured to determine a position of the robot relative to the magnetic field transmitter, based on detection of the transmitter magnetic field by the magnetic field receiver and detection of the at least one motion characteristic by the movement sensor,
wherein the position determination circuit is configured to perform a self-calibration based on data representing the calibration magnetic field as sensed by the magnetic field receiver.

17. The system of claim 16, wherein the magnetic field transmitter comprises three transmission coils, each of the three transmission coils defining a transmitter coil axis and being configured to generate a component of the transmitter magnetic field, wherein the transmitter coil axes are orthogonal in three dimensions, and wherein the transmission coils are arranged to approximate at least part of an outline of a first sphere; and wherein the magnetic field receiver comprises three sensor coils, each of the three sensor coils defining a sensor coil axis and being responsive to a component of the transmitter magnetic field, wherein the sensor coil axes are orthogonal in three dimensions, and wherein the sensor coils are arranged to approximate at least part of an outline of a second sphere, the second sphere being smaller in diameter than the first sphere.

18. The system of claim 17, wherein the calibration coil defines an equal angle with respect to each of the sensor coils.

19. The system of claim 17, wherein the robot and magnetic field transmitter are physically disconnected.

20. A method of estimating pose as performed by a mobile robot, the method comprising:
detecting at least one motion characteristic using a movement sensor of the mobile robot;
producing a calibration magnetic field using a calibration coil of the mobile robot;

detecting the calibration magnetic field using a sensor circuit of the mobile robot;

calibrating the sensor circuit based on calibration data representing the calibration magnetic field, thereby resulting in a calibrated sensor circuit;

detecting a transmitter magnetic field using the calibrated sensor circuit; and estimating a pose of the mobile robot based on data representing the transmitter magnetic field, as detected using the calibrated sensor circuit, and the at least one motion characteristic.

21. The method of claim 20, wherein the sensor circuit comprises a filter circuit and sensor coils responsive to the transmitter magnetic field; and wherein calibrating the sensor circuit comprises determining coefficients for the filter circuit based on the calibration data, and applying the coefficients to the filter circuit to normalize a difference in gains of frequency channels corresponding to different frequencies received by the sensor coils.

22. The method of claim 20, wherein the sensor circuit comprises an amplifier circuit; and wherein calibrating the sensor circuit comprises determining gains of the amplifier circuit based on the calibration data, and applying the gains to the amplifier circuit to enable dynamic changes to amplitudes of calibration signals output by the sensor circuit.

23. The method of claim 20, wherein calibrating the sensor circuit comprises comparing, to a threshold, a difference between an amplitude of the calibration magnetic field and an amplitude of the transmitter magnetic field, and calibrating the sensor circuit based on the difference.

24. The method of claim 20, wherein the calibrated sensor circuit generates detection signals in response to detecting frequencies of components of the transmitter magnetic field, the frequencies being between a maximum magnetic field frequency and a minimum magnetic field frequency, the maximum magnetic field frequency and the minimum magnetic field frequency being based on an output of the calibration coil.

* * * * *